US012588362B2

(12) United States Patent
Kim et al.

(10) Patent No.: US 12,588,362 B2
(45) Date of Patent: Mar. 24, 2026

(54) DISPLAY APPARATUS HAVING A FIRST INSULATING LAYER INCLUDING FIRST PORTION AND SECOND PORTION

(71) Applicant: Samsung Display Co., Ltd., Yongin-Si (KR)

(72) Inventors: Seulki Kim, Yongin-si (KR); Yeeun Kang, Yongin-si (KR); Shoyeon Kim, Yongin-si (KR); Seungrae Kim, Yongin-si (KR); Donghyun Won, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 572 days.

(21) Appl. No.: 17/974,470

(22) Filed: Oct. 26, 2022

(65) Prior Publication Data

US 2023/0320136 A1 Oct. 5, 2023

(30) Foreign Application Priority Data

Mar. 21, 2022 (KR) ........................ 10-2022-0034933

(51) Int. Cl.
H01L 29/08 (2006.01)
H10K 59/121 (2023.01)
(Continued)

(52) U.S. Cl.
CPC ..... H10K 59/1216 (2023.02); H10K 59/1213 (2023.02); H10K 59/124 (2023.02);
(Continued)

(58) Field of Classification Search
CPC ........... H10K 59/1216; H10K 59/1213; H10K 59/124; H10K 59/1201; H10K 71/00; H10D 30/6755; H10D 86/60
(Continued)

(56) References Cited

U.S. PATENT DOCUMENTS 8,071,985 B2 12/2011 Sakurai et al.
10,903,251 B2 1/2021 Tsuno et al.
(Continued)

FOREIGN PATENT DOCUMENTS

KR 10-0918138 B1 9/2009
KR 20100110125 A * 10/2010
(Continued)

OTHER PUBLICATIONS

Cite the machine translation Heeyoong K (KR-20210008768-A).*
Cite the machine translation Kwon K (KR-20100110125-A).*

*Primary Examiner* — Phuc T Dang
(74) *Attorney, Agent, or Firm* — Innovation Counsel LLP

(57) ABSTRACT

A display apparatus and a method of manufacturing the same are provided. The display apparatus includes a thin-film transistor including a semiconductor layer including a source region and a gate electrode overlapping the channel region, a lower electrode disposed under the semiconductor layer, a capacitor electrically connected to the thin-film transistor and including a first capacitor electrode and a second capacitor electrode over the first capacitor electrode, the first capacitor electrode being disposed on a same layer as the lower electrode, and a first insulating layer including a first portion and a second portion, the first portion being between the lower electrode and the semiconductor layer, and the second portion being between the first capacitor electrode and the second capacitor electrode, wherein a thickness of the second portion of the first insulating layer is less than a thickness of the first portion of the first insulating layer.

10 Claims, 26 Drawing Sheets

(51) Int. Cl.

| | | |
|---|---|---|
| *H10K 59/124* | (2023.01) |
| *H10K 71/00* | (2023.01) |
| *H10D 30/67* | (2025.01) |
| *H10D 86/40* | (2025.01) |
| *H10D 86/60* | (2025.01) |
| *H10K 59/12* | (2023.01) |

(52) U.S. Cl.
CPC ......... *H10K 71/00* (2023.02); *H10D 30/6755* (2025.01); *H10D 86/423* (2025.01); *H10D 86/481* (2025.01); *H10D 86/60* (2025.01); *H10K 59/1201* (2023.02)

(58) Field of Classification Search
USPC .......................................................... 257/40
See application file for complete search history.

(56) References Cited

U.S. PATENT DOCUMENTS

| | | | |
|---|---|---|---|
| 11,183,535 B2 | 11/2021 | Choi |
| 11,825,706 B2 | 11/2023 | Jeon et al. |

FOREIGN PATENT DOCUMENTS

| | | | | |
|---|---|---|---|---|
| KR | 10-1739636 | B1 | | 5/2017 |
| KR | 10-2019-0093240 | A | | 8/2019 |
| KR | 10-2009854 | B1 | | 8/2019 |
| KR | 20210008768 | A | * | 1/2021 |
| KR | 10-2021-0138843 | A | | 11/2021 |

* cited by examiner 101          102          CE1          111

DISPLAY APPARATUS HAVING A FIRST INSULATING LAYER INCLUDING FIRST PORTION AND SECOND PORTION

CROSS-REFERENCE TO RELATED APPLICATION

This application is based on and claims priority under 35 U.S.C. § 119 to Korean Patent Application No. 10-2022-0034933, filed on Mar. 21, 2022, in the Korean Intellectual Property Office, the disclosure of which is incorporated by reference herein in its entirety.

BACKGROUND

1. Field of Disclosure

The present disclosure generally relates to a display apparatus and a method of manufacturing the same. More particularly, the present disclosure relates to a display apparatus with a reduced number of masks applied to a manufacturing process, improved productivity, and improved performance of a capacitor and a method of manufacturing the same.

2. Description of the Related Art

With the development of various electronic apparatuses, such as mobile phones, personal digital assistants (PDAs), large-scale televisions, and the like, various types of display apparatuses applicable thereto are under development. As an example, a display apparatus widely used in the market includes a liquid crystal display apparatus having a backlight unit, and an organic light-emitting display apparatus that emits light of different colors for each color region. Recently, a display apparatus having a quantum dot-color conversion layer (QD-CCL) has been developed.

Generally, an organic light-emitting display apparatus includes a sub-pixel circuit including thin-film transistors, and organic light-emitting elements over a substrate, wherein the organic light-emitting elements spontaneously emit light. In a process of forming a sub-pixel circuit and an organic light-emitting element over a substrate, a photolithography process that uses a mask may be used a plurality of times. A photolithography process is a series of processes of transferring a pattern designed on a mask to a substrate on which thin-film layers, such as a metal layer, an organic layer, an inorganic layer, and the like, have been deposited, and forming a desired pattern on the thin-film layers. The photolithography process includes coating, exposing, and developing processes.

SUMMARY

When the number of masks and the number of photolithography processes used in a manufacturing process increase, costs for manufacturing a display apparatus may increase and productivity may be reduced.

One or more embodiments include a display apparatus with a reduced number of masks applied to a manufacturing process, improved productivity, and improved performance of a capacitor, and a method of manufacturing a display apparatus. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a thin-film transistor including a semiconductor layer and a gate electrode, wherein the semiconductor layer includes a channel region, a source region, and a drain region, the source region and the drain region disposed on two opposite sides of the channel region, and the gate electrode overlapping the channel region, a lower electrode disposed under the semiconductor layer, a capacitor electrically connected to the thin-film transistor, and including a first capacitor electrode and a second capacitor electrode disposed over the first capacitor electrode, the first capacitor electrode disposed on a same layer as the lower electrode, and a first insulating layer including a first portion and a second portion, the first portion disposed between the lower electrode and the semiconductor layer, and the second portion disposed between the first capacitor electrode and the second capacitor electrode, wherein a thickness of the second portion of the first insulating layer is less than a thickness of the first portion of the first insulating layer.

The first insulating layer may include a recess portion overlapping the first capacitor electrode, and at least a portion of the second capacitor electrode may be located inside the recess portion.

The display apparatus may further include a second insulating layer disposed on the first insulating layer, wherein the second insulating layer may include a first portion disposed between the semiconductor layer and the gate electrode, and wherein an opening defined in the second insulating layer that overlaps the recess portion.

A portion of the second insulating layer may be located between a lower surface of the second capacitor electrode and an upper surface of the first insulating layer.

The second portion of the first insulating layer may be located below the recess portion.

A lateral surface of the recess portion of the first insulating layer and a lateral surface of the opening of the second insulating layer may be located on a same inclined surface.

The second capacitor electrode may include a plurality of sub-layers, and the gate electrode may include a plurality of sub-layers.

A number of sub-layers of the second capacitor electrode may be equal to a number of sub-layers of the gate electrode.

The semiconductor layer may include an oxide semiconductor material.

The display apparatus may further include an interlayer insulating layer covering the gate electrode and the second capacitor electrode, a planarization layer covering the interlayer insulating layer, and a display element disposed on the planarization layer and electrically connected to the thin-film transistor, wherein the display element includes a sub-pixel electrode, an opposite electrode, and an emission layer which is disposed between the sub-pixel electrode and the opposite electrode, the opposite electrode disposed over the sub-pixel electrode.

According to one or more embodiments, a method of manufacturing a display apparatus includes forming a lower electrode and a first capacitor electrode, which are disposed on a substrate, forming a first insulating layer disposed on the lower electrode and the first capacitor electrode, forming a semiconductor layer disposed on the first insulating layer, removing a portion of the first insulating layer that overlaps the first capacitor electrode, forming a gate electrode that overlaps the semiconductor layer, and forming a second capacitor electrode that overlaps the first capacitor electrode, wherein the first insulating layer includes a first portion and a second portion, the first portion disposed between the lower electrode and the semiconductor layer, and the second portion disposed between the first capacitor electrode and the second capacitor electrode, wherein a thickness of the second portion of the first insulating layer is less than a thickness of the first portion of the first insulating layer.

The removing of the portion of the first insulating layer may be accomplished by forming a recess portion of the first insulating layer that overlaps the first capacitor electrode, wherein at least a portion of the second capacitor electrode may be located inside the recess portion.

The method may further include forming a second insulating layer on the semiconductor layer, and forming an opening that overlaps the recess portion of the first insulating layer by removing a portion of the second insulating layer.

A portion of the second insulating layer may be located between a lower surface of the second capacitor electrode and an upper surface of the first insulating layer.

The forming of the opening of the second insulating layer, and the forming of the recess portion of the first insulating layer may be performed by using a same mask.

The mask may include a half-tone mask or a slit mask.

The second portion of the first insulating layer may be located below the recess portion of the first insulating layer.

A lateral surface of the recess portion of the first insulating layer and a lateral surface of the opening of the second insulating layer may be located on a same inclined surface.

The forming of the second capacitor electrode and the forming of the gate electrode may be performed simultaneously.

The semiconductor layer may include an oxide semiconductor.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A, 8A, 9, 10, 11, 12, 13, 14A, 15A, 16, 17A, 18, 19, 20, and 21 are cross-sectional views showing a method of manufacturing a display apparatus according to an embodiment.

DETAILED DESCRIPTION

Figure 1:
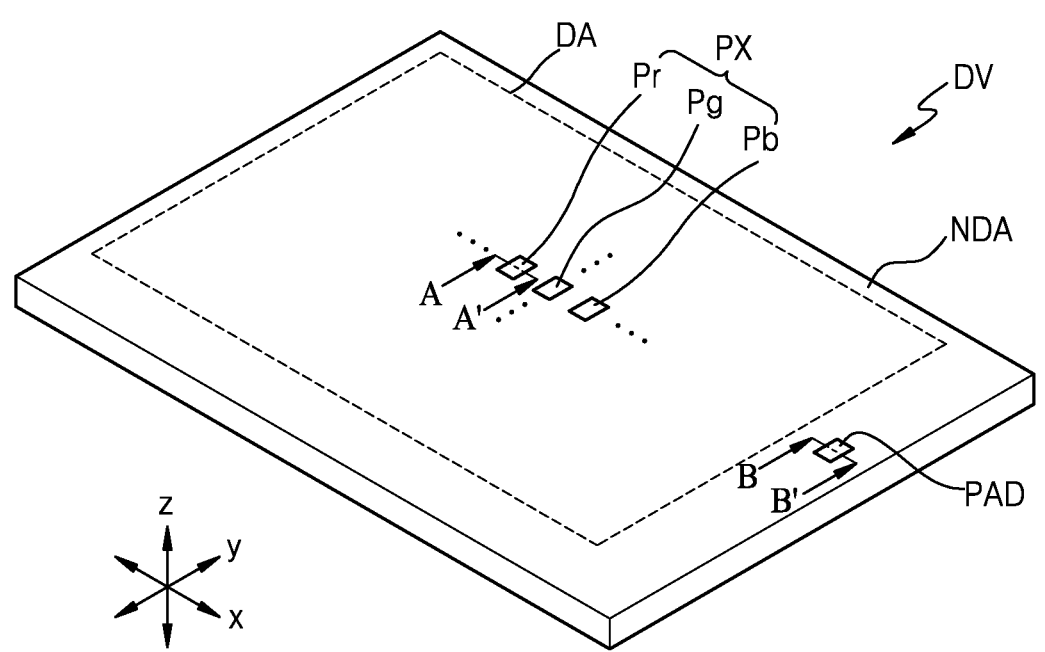
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the present specification, "A and/or B" means A or B, or A and B. In the present specification, "at least one of A and B" means A or B, or A and B.

As used herein, when a wiring is referred to as "extending in a first direction or a second direction", it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

Hereinafter, embodiments of the present disclosure are described in detail with reference to the accompanying drawings. When description is made with reference to the drawings, like reference numerals are used for like or corresponding elements.

FIG. 1 is a schematic perspective view of a display apparatus DV according to an embodiment.

Referring to FIG. 1, the display apparatus DV may include a display area DA and a non-display area NDA outside the display area DA. The display apparatus DV may be configured to display images through an array of a plurality of sub-pixels arranged two-dimensionally on an x-y plane in the display area DA. The plurality of sub-pixels include a first sub-pixel, a second sub-pixel, and a third sub-pixel. Hereinafter, for convenience of description, the case where the first sub-pixel is a red sub-pixel Pr, the second sub-pixel is a green sub-pixel Pg, and the third sub-pixel is a blue sub-pixel Pb is described.

The red sub-pixel Pr, the green sub-pixel Pg, and the blue sub-pixel Pb are regions that respectively emit red, green, and blue light. The display apparatus DV may display images by using lights emitted from the sub-pixels.

The non-display area NDA is a region that does not display images and may surround the display area DA entirely or partially. Various wirings and a pad portion PAD may be arranged in the non-display area NDA, wherein the various wirings provide electric signals or power to sub-pixel circuits, and a printed circuit board or a driver integrated circuit (IC) is attached to the pad portion PAD.

As shown in FIG. 1, the display area DA may have a polygonal shape including a quadrangular shape. As an example, the display area DA may have a rectangular shape in which a horizontal length thereof is greater than a vertical length, a rectangular shape in which a horizontal length thereof is less than a vertical length, or a square shape. Alternatively, the display area DA may have various shapes, such as an elliptical shape or a circular shape.

Figure 2:
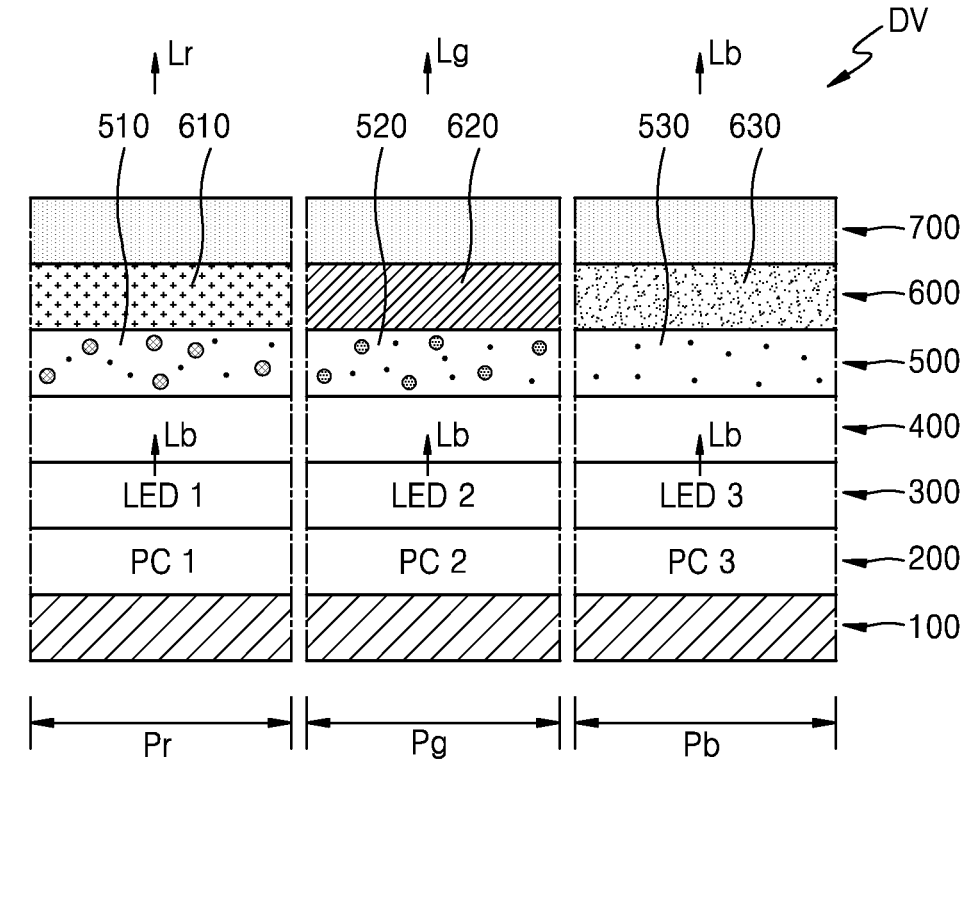
FIG. 2 is a schematic perspective view of the display apparatus according to an embodiment.

FIG. 2 is a schematic cross-sectional view of respective sub-pixels of the display apparatus DV according to an embodiment.

Referring to FIG. 2, the display apparatus DV may include a circuit layer 200 on a substrate 100. The circuit layer 200 may include first to third sub-pixel circuits PC1, PC2, and PC3. Each of first to third sub-pixel circuits PC1, PC2, and PC3 may be connected to each of first to third display elements LED1, LED2, and LED3 of a display element layer 300, respectively.

Each of the first to third display elements LED1, LED2, and LED3 may include an organic light-emitting diode including an organic material. In another embodiment, each of the first to third display elements LED1, LED2, and LED3 may include an inorganic light-emitting diode including an inorganic material. The inorganic light-emitting diode may include a PN-junction diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers. In an embodiment, each of the first to third display elements LED1, LED2, and LED3 may be a light-emitting diode including quantum dots. As described above, an emission layer of the first to third display elements LED1, LED2, and LED3 may include an organic material, an inorganic material, quantum dots, an organic material and quantum dots, or an inorganic material and quantum dots. Hereinafter, the case where the first to third display elements LED1, LED2, and LED3 are organic light-emitting diodes, is described.

The first to third display elements LED1, LED2, and LED3 may emit light of the same color. As an example, light (e.g., blue light Lb) emitted from the first to third display elements LED1, LED2, and LED3 may pass through a functional layer 500 through an encapsulation layer 400 on the display element layer 300.

The functional layer 500 may include optical portions configured to convert the color of light (e.g., blue light Lb)

emitted from the display element layer 300, or configured to transmit the light without converting the color. As an example, the functional layer 500 may include color-converting portions and a transmission portion, wherein the color-converting portions convert light (e.g., blue light Lb) emitted from the display element layer 300 to light of a different color, and the transmission layer transmits light (e.g., blue light Lb) emitted from the display element layer 300 without converting a color thereof. The functional layer 500 may include a first color-converting portion 510 corresponding to the red sub-pixel Pr, a second color-converting portion 520 corresponding to the green sub-pixel Pg, and a transmissive portion 530 corresponding to the blue sub-pixel Pb. The first color-converting portion 510 may convert blue light Lb into red light Lr, and the second color-converting portion 520 may convert blue light Lb into green light Lg. The transmissive portion 530 may transmit blue light Lb without converting the blue light Lb.

A color layer 600 may be disposed on the functional layer 500. The color layer 600 may include first to third color filters 610, 620, and 630 of different colors. As an example, the first color filter 610 may be a red color filter, the second color filter 620 may be a green color filter, and the third color filter 630 may be a blue color filter.

Light that is color-converted or transmitted by the functional layer 500 may be improved in color purity thereof while respectively passing through the first to third color filters 610, 620, and 630. In addition, the color layer 600 may prevent or reduce external light (e.g., light incident to the display apparatus DV from the outside of the display apparatus DV) from being reflected and viewed by a user.

A light-transmissive base layer 700 may be provided to the color layer 600. The light-transmissive base layer 700 may include glass or a light-transmissive organic material. As an example, the light-transmissive base layer 700 may include a light-transmissive organic material, such as acryl-based resin.

In an embodiment, the light-transmissive base layer 700 is a kind of substrate. The color layer 600 and the functional layer 500 are formed on the light-transmissive base layer 700, and then the light-transmissive base layer 700 may be integrated with the encapsulation layer 400 such that the functional layer 500 faces the encapsulation layer 400.

In another embodiment, after the functional layer 500 and the color layer 600 are sequentially formed on the encapsulation layer 400, the light-transmissive base layer 700 may be directly coated and hardened on the color layer 600. In an embodiment, another optical film, for example, an anti-reflection (AR) film and the like may be disposed on the light-transmissive base layer 700.

The display apparatus DV having the above structure may include electronic apparatuses that may display moving images or still images, such as televisions, advertisement boards, theater screens, monitors, tablet personal computers, and the like.

Figure 3:
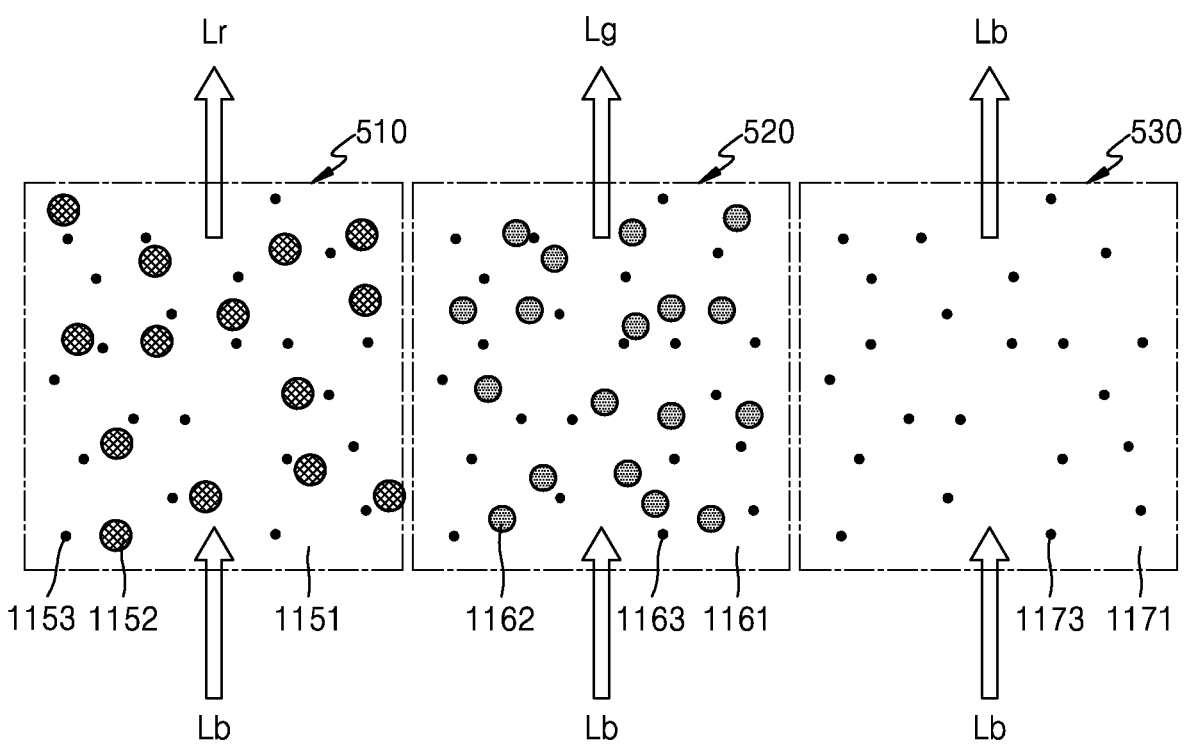
FIG. 3 is a view of respective optical layers of the functional layer of FIG. 2.

FIG. 3 is a view of respective optical portions of the functional layer 500 of FIG. 2.

Referring to FIG. 3, the first color-converting portion 510 may convert blue light Lb incident thereto into red light Lr. As shown in FIG. 3, the first color-converting portion 510 may include a first photosensitive polymer 1151, first quantum dots 1152 dispersed in the first photosensitive polymer 1151, and first scattering particles 1153.

The first quantum dots 1152 may be excited by blue light Lb and may emit red light Lr having a greater wavelength than the wavelength of the blue light Lb isotropically. The first photosensitive polymer 1151 may be an organic material having light transmittance. The first scattering particles 1153 may increase a color-converting efficiency by scattering blue light Lb not absorbed by the first quantum dots 1152 and allowing more first quantum dots 1152 to be excited. The first scattering particles 1153 may be, for example, titanium oxide ($TiO_2$), metal particles, or the like. The first quantum dots 1152 may be one of a Group II-Group VI compound, a Group III-Group V compound, a Group IV-Group VI compound, a Group IV element, a Group IV compound, and a combination thereof.

The second color-converting portion 520 may convert blue light Lb incident thereto to green light Lg. As shown in FIG. 3, the second color-converting portion 520 may include a second photosensitive polymer 1161, second quantum dots 1162 dispersed in the second photosensitive polymer 1161, and second scattering particles 1163.

The second quantum dots 1162 may be excited by blue light Lb and may emit green light Lg having a greater wavelength than the wavelength of the blue light Lb isotropically. The second photosensitive polymer 1161 may be an organic material having light transmittance.

The second scattering particles 1163 may increase a color-converting efficiency by scattering blue light Lb not absorbed by the second quantum dots 1162 and allowing more second quantum dots 1162 to be excited. The second scattering particles 1163 may be, for example, titanium oxide ($TiO_2$), metal particles, or the like. The second quantum dots 1162 may be one of a Group II-Group VI compound, a Group III-Group V compound, a Group IV-Group VI compound, a Group IV element, a Group IV compound, and a combination thereof.

The transmissive portion 530 may transmit blue light Lb without converting the blue light Lb incident to the transmissive portion 530. As shown in FIG. 3, the transmissive portion 530 may include a third photosensitive polymer 1171 in which third scattering particles 1173 are dispersed. The third photosensitive polymer 1171 may include, for example, an organic material having a light transmittance, such as silicon resin, epoxy resin, and the like, and include the same material as that of the first photosensitive polymer 1151 and the second photosensitive polymer 1161. The third scattering particles 1173 may scatter and emit blue light Lb and include the same material as those of the first and second scattering particles 1153 and 1163. Unlike the first and second color-converting portions 510 and 520, the transmissive portion 530 does not include quantum dots.

Figure 4:
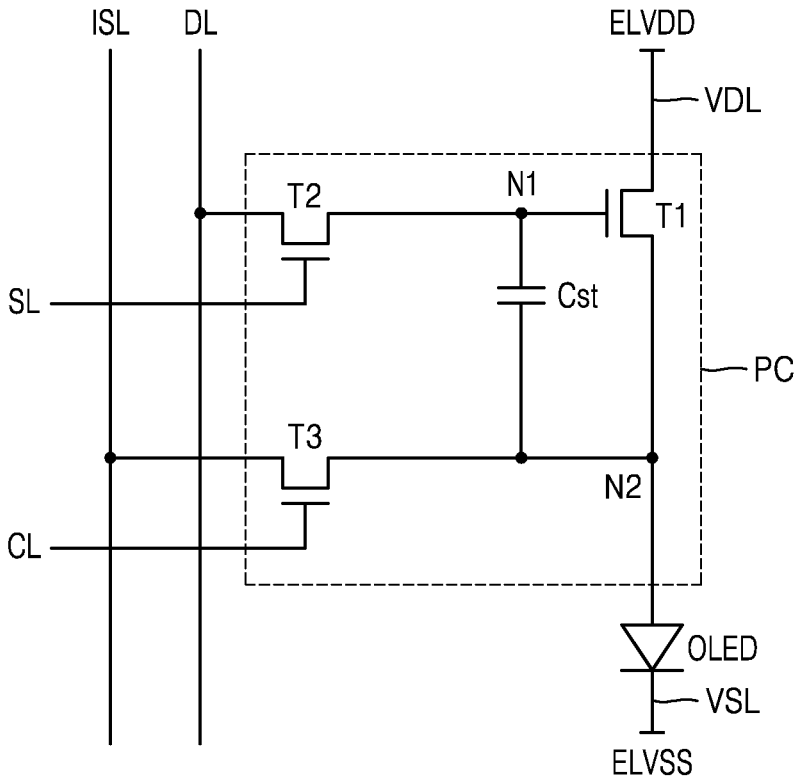
FIG. 4 is an equivalent circuit diagram of a sub-pixel circuit electrically connected to a display element of a display apparatus according to an embodiment.

FIG. 4 is a schematic equivalent circuit diagram of a display element of a display apparatus and a sub-pixel circuit electrically connected to the display element according to an embodiment. A sub-pixel circuit PC shown in FIG. 4 may correspond to each of the first to third sub-pixel circuits PC1, PC2, and PC3 described above with reference to FIG. 2, and the organic light-emitting diode OLED of FIG. 4 may correspond to each of the first to third display elements LED1, LED2, and LED3 described above with reference to FIG. 2.

Referring to FIG. 4, a first electrode (e.g., an anode) of a light-emitting diode, for example, the organic light-emitting diode OLED, may be connected to the sub-pixel circuit PC, and a second electrode (e.g., a cathode) of the organic light-emitting diode OLED may be connected to a common voltage line VSL configured to provide a common voltage ELVSS. The organic light-emitting diode OLED may emit light at a brightness corresponding to the amount of current supplied from the sub-pixel circuit PC.

The sub-pixel circuit PC may be configured to control the amount of current flowing from a driving voltage ELVDD to the common voltage ELVSS through the organic light-emitting diode OLED according to a data signal. The sub-pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may be an oxide semiconductor transistor including a semiconductor layer that includes an oxide semiconductor, or may be a silicon semiconductor transistor including a semiconductor that includes polycrystalline silicon. A first electrode may be one of a source electrode and a drain electrode, and a second electrode may be the other of the source electrode and the drain electrode depending on the type of a transistor.

The first electrode of the first thin-film transistor T1 may be connected to a driving voltage line VDL configured to supply the driving voltage ELVDD, and the second electrode of the first thin-film transistor T1 may be connected to the first electrode of the organic light-emitting diode OLED. A gate electrode of the first thin-film transistor T1 may be connected to a first node N1. The first thin-film transistor T1 may be configured to control the amount of current flowing from the driving voltage ELVDD to the organic light-emitting diode OLED according to a voltage of the first node N1.

The second thin-film transistor T2 may be a switching transistor. A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. When a scan signal is supplied through the scan line SL, the second thin-film transistor T2 may be turned on to electrically connect the data line DL to the first node N1.

The third thin-film transistor T3 may be an initialization transistor and/or a sensing transistor. A first electrode of the third thin-film transistor T3 may be connected to the second node N2, and a second electrode of the third thin-film transistor T3 may be connected to a sensing line ISL. A gate electrode of the third thin-film transistor T3 may be connected to a control line CL.

The storage capacitor Cst may be connected between the first node N1 and the second node N2. As an example, a first capacitor electrode of the storage capacitor Cst may be connected to the gate electrode of the first thin-film transistor T1, and a second capacitor electrode of the storage capacitor Cst may be connected to the first electrode of the organic light-emitting diode OLED.

Though it is shown in FIG. 4 that the first thin-film transistor T1, the second thin-film transistor T2, and the third thin-film transistor T3 are n-channel metal oxide semiconductor (NMOS) transistors, the embodiment is not limited thereto. As an example, at least one of the first thin-film transistor T1, the second thin-film transistor T2, and the third thin-film transistor T3 may include a p-channel metal oxide semiconductor (PMOS) transistor.

Though FIG. 4 shows three thin-film transistors and one storage capacitor, the embodiment is not limited thereto. The sub-pixel circuit PC may include four or more thin-film transistors and/or two or more storage capacitors. In an embodiment, the sub-pixel circuit PC may include seven transistors and one storage capacitor.

Figure 5:
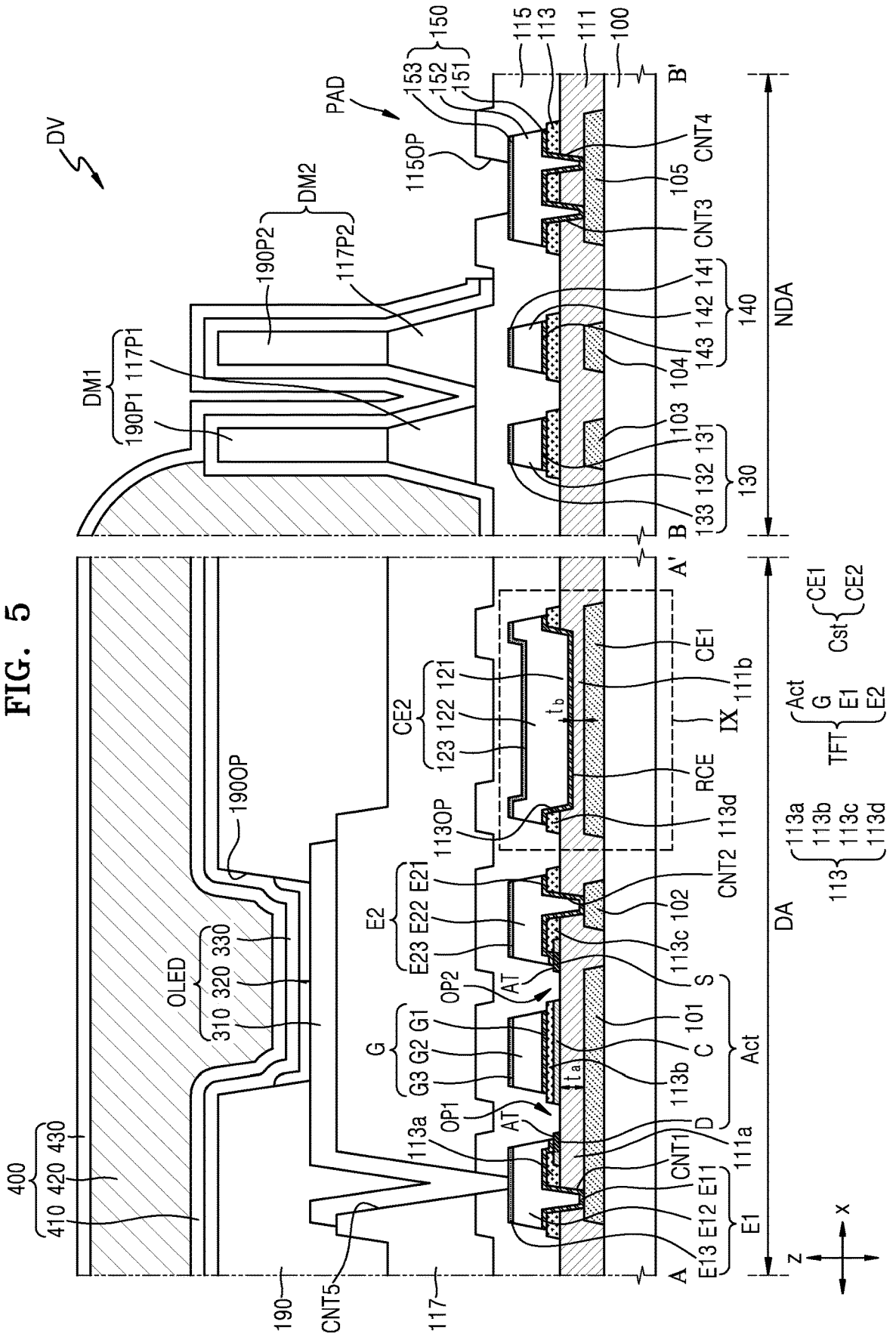
FIG. 5 is a schematic cross-sectional view of the display apparatus according to an embodiment.
Figure 6:
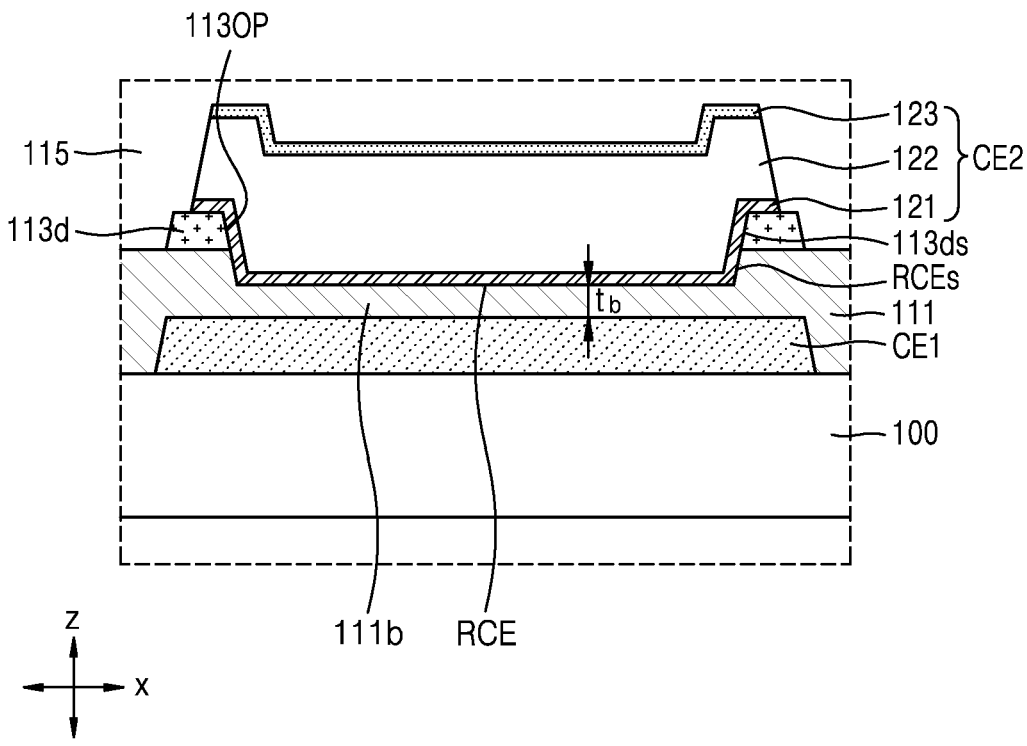
FIG. 6 is a schematic cross-sectional view of a display apparatus according to an embodiment.

FIG. 5 is a schematic cross-sectional view of the display apparatus DV according to an embodiment. FIG. 5 shows a cross-section of the display apparatus DV taken along lines A-A' and B-B' of FIG. 1. FIG. 6 is an enlarged cross-sectional view of a region IX of FIG. 5.

Referring to FIGS. 5 and 6, the display apparatus DV may include the thin-film transistor TFT and the storage capacitor Cst arranged in the display area DA, and a first dam DM1, a second dam DM2, and the pad portion PAD each arranged in the non-display area NDA. The thin-film transistor TFT may correspond to at least one of the first to third thin-film transistors T1, T2, and T3 described with reference to FIG. 4.

The thin-film transistor TFT may include a semiconductor layer Act and a gate electrode G. The storage capacitor Cst may include a first capacitor electrode CE1 and a second capacitor electrode CE2. The pad portion PAD may include an auxiliary pad electrode 105 and a pad electrode 150.

The substrate 100 may include a glass material, a ceramic material, metal, or a flexible or bendable material. In the case where the substrate 100 is flexible or bendable, the substrate 100 may include polymer resin including polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may have a single-layered structure or a multi-layered structure of the above materials, and may further include an inorganic layer in the case of the multi-layered structure. In an embodiment, the substrate 100 may have a structure of an organic material/inorganic material/organic material.

A buffer layer 111 which is a first insulating layer may reduce or block penetration of foreign materials, moisture, or external air from below the substrate 100 and provide a flat surface on the substrate 100. The buffer layer 111 may include an inorganic material, an organic material, or an organic/inorganic composite material, and include a single layer or a multi-layer including an inorganic material and an organic material, the inorganic material including oxide or nitride.

A barrier layer (not shown) may be further disposed between the substrate 100 and the buffer layer 111. The barrier layer may prevent or reduce the penetration of impurities from the substrate 100 and the like to the semiconductor layer Act. The barrier layer may include an inorganic material, an organic material, or an organic/inorganic composite material, and include a single layer or a multi-layer including an inorganic material and an organic material, the inorganic material including oxide or nitride.

A first lower electrode 101, a second lower electrode 102, the first capacitor electrode CE1 of the storage capacitor Cst, a first wiring 103, a second wiring 104, and the auxiliary pad electrode 105 may be disposed between the substrate 100 and the buffer layer 111. In an embodiment, the first lower electrode 101 and the second lower electrode 102 may each be one of a source electrode, a drain electrode, and a signal line, such as a data line. In an embodiment, the first wiring 103 and the second wiring 104 may each be one of a voltage supply line and a signal line. As an example, the first wiring 103 and the second wiring 104 may each be a common voltage supply line or a driving voltage supply line.

The first lower electrode 101, the second lower electrode 102, the first capacitor electrode CE1, the first wiring 103, the second wiring 104, and the auxiliary pad electrode 105 may include at least one of conductive materials including molybdenum (Mo), aluminum (Al), copper (Cu), titanium (Ti), and the like, and have a single-layered structure or a multi-layered structure including the above materials.

The semiconductor layer Act may be disposed on the buffer layer 111. The semiconductor layer Act may overlap the first lower electrode 101. The semiconductor layer Act may include an oxide semiconductor material. Though it is shown in FIG. 5 that the semiconductor layer Act includes an oxide semiconductor, the semiconductor layer Act may include amorphous silicon or polycrystalline silicon in an embodiment. Hereinafter, the case where the semiconductor layer Act includes an oxide semiconductor is described in an embodiment.

The semiconductor layer Act may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the semiconductor layer Act may be an ITZO (InSnZnO) semiconductor layer or an IGZO (InGaZnO) semiconductor layer. Because an oxide semiconductor has a wide band gap (of about 3.1 eV), a high carrier mobility, and a low leakage current, a voltage drop is not large even though a driving time is long, and thus, the oxide semiconductor has an advantage that a brightness change due to a voltage drop is not large even when the display apparatus is driven at low frequencies.

The semiconductor layer Act may include a channel region C, a source region S, and a drain region D, wherein the source region S and the drain region D are arranged on two opposite sides of the channel region C.

A first opening OP1 and a second opening OP2 may be respectively formed in the drain region D and the source region S of the semiconductor layer Act. The first opening OP1 and the second opening OP2 may be respectively arranged in two opposite sides of the channel region C with respect to the channel region C interdisposed therebetween. The first opening OP1 may be adjacent to a first electrode E1, and the second opening OP2 may be adjacent to a second electrode E2.

A gate insulating layer 113, which is a second insulating layer, may be disposed on the semiconductor layer Act. The gate insulating layer 113 may include silicon oxide, silicon nitride, silicon oxynitride, aluminum oxide, titanium oxide, tantalum oxide, hafnium oxide, or zinc oxide.

The gate insulating layer 113 may be patterned to overlap a portion of the semiconductor layer Act. As an example, the gate insulating layer 113 may be patterned to expose the source region S and the drain region D. A region of the semiconductor layer Act that overlaps the gate insulating layer 113 may correspond to the channel region C. Exposed regions of the semiconductor layer Act that do not overlap the gate insulating layer 113 may become conductive by a plasma treatment and the like. The conductive regions of the semiconductor layer Act may include the source region S and the drain region D. In another embodiment, the gate insulating layer 113 may not be patterned to overlap a portion of the semiconductor layer Act, but may be disposed on the entire surface of the substrate 100 to cover the semiconductor layer Act.

The gate insulating layer 113 may include a plurality of portions spaced apart from each other, for example, a first insulating pattern 113*a*, a second insulating pattern 113*b*, a third insulating pattern 113*c*, and a fourth insulating pattern 113*d*. The first insulating pattern 113*a* and the third insulating pattern 113*c* may be disposed to respectively cover the ends of the semiconductor layer Act. The second insulating pattern 113*b* may overlap the channel region C. The fourth insulating pattern 113*d* may overlap the first capacitor electrode CE1. As an example, the fourth insulating pattern 113*d* may be located between the lower surface of the second capacitor electrode CE2 and the upper surface of the buffer layer 111.

Because portions of the semiconductor layer Act that overlap the first to third insulating patterns 113$a$, 113$b$, and 113$c$ are not exposed to a plasma treatment and thus does not become conductive, the portions thereof may have different properties from those of portions exposed to the plasma treatment.

A portion of the semiconductor layer Act under the first electrode E1 may include a first portion (not shown) and a second portion (not shown) having different carrier concentrations. The first portion may have a carrier concentration corresponding to one of the source region S and the drain region D. The second portion is covered by the first insulating pattern 113$a$ and may have a less carrier concentration than that of the first portion. A material of the second portion may be the same as that of the channel region C. Like the channel region C, the second portion may be a non-conductive portion. The first portion may include a tail region AT adjacent to the first opening OP1. The tail region AT may be connected to another conductive portion of the semiconductor layer Act. A portion of the semiconductor layer Act under the second electrode E2 may have a similar structure.

The gate electrode G may be disposed on the gate insulating layer 113 to overlap the channel region C. In addition, the second capacitor electrode CE2 of the storage capacitor Cst, the first electrode E1, the second electrode E2, the third wiring 130, the fourth wiring 140, and the pad electrode 150 may be disposed on the gate insulating layer 113. In an embodiment, each of the third wiring 130 and the fourth wiring 140 may overlap each of the first wiring 103 and the second wiring 104 respectively. The third wiring 130 and the fourth wiring 140 may be one of the voltage supply line and the signal line.

Each of the first electrode E1, the second electrode E2, the gate electrode G, the second capacitor electrode CE2, the third wiring 130, the fourth wiring 140, and the pad electrode 150 may include at least one of conductive materials including molybdenum (Mo), aluminum (Al), copper (Cu), titanium (Ti), and the like, and have a single-layered structure or a multi-layered structure including the above materials. As an example, each of the second capacitor electrode CE2, the first electrode E1, the second electrode E2, the third wiring 130, the fourth wiring 140, and the pad electrode 150 may have a multi-layered structure of Ti/Al/Ti.

Each of the first electrode E1, the second electrode E2, the gate electrode G, the second capacitor electrode CE2, the third wiring 130, the fourth wiring 140, and the pad electrode 150 may have a plurality of sub-layers. As an example, the first electrode E1 may include a first layer E11, a second layer E12 on the first layer E11, and a third layer E13 on the second layer E12. Similarly, the second electrode E2 may include a first layer E21, a second layer E22 on the first layer E21, and a third layer E23 on the second layer E22. The gate electrode G may include a first layer G1, a second layer G2 on the first layer G1, and a third layer G3 on the second layer G2. The second capacitor electrode CE2 may include a first layer 121, a second layer 122 on the first layer 121, and a third layer 123 on the second layer 122. The third wiring 130 may include a first layer 131, a second layer 132 on the first layer 131, and a third layer 133 on the second layer 132. The fourth wiring 140 may include a first layer 141, a second layer 142 on the first layer 141, and a third layer 143 on the second layer 142. In addition, the pad electrode 150 may include a first layer 151, a second layer 152 on the first layer 151, and a third layer 153 on the second layer 152.

The first electrode E1 may overlap the first lower electrode 101. The first electrode E1 may be connected to the first lower electrode 101 through a first contact hole CNT1 passing through the buffer layer 111 and the gate insulating layer 113. The first electrode E1 may be connected to a portion of the semiconductor layer Act, for example, a portion of the drain region D. The semiconductor layer Act may be connected to the first lower electrode 101 through the first electrode E1. The first electrode E1 may serve as a bridge connecting the semiconductor layer Act to the first lower electrode 101.

The second electrode E2 may overlap the second lower electrode 102. The second electrode E2 may be connected to the second lower electrode 102 through a second contact hole CNT2 passing through the buffer layer 111 and the gate insulating layer 113. The second electrode E2 may be connected to a portion of the semiconductor layer Act, for example, a portion of the source region S. The semiconductor layer Act may be connected to the second lower electrode 102 through the second electrode E2. The second electrode E2 may serve as a bridge connecting the semiconductor layer Act to the second lower electrode 102.

The pad electrode 150 may overlap the auxiliary pad electrode 105. The pad electrode 150 may be connected to the auxiliary pad electrode 105 through a third contact hole CNT3 and a fourth contact hole CNT4 passing through the buffer layer 111 and the gate insulating layer 113. Though FIG. 5 shows two contact holes through which the pad electrode 150 is connected to the auxiliary pad electrode 105, the number of contact holes may be greater or less than two. In addition, though FIG. 5 shows the auxiliary pad electrode 105, the auxiliary pad electrode 105 may be omitted in an embodiment.

Referring to FIGS. 5 and 6, the second capacitor electrode CE2 of the storage capacitor Cst may overlap the first capacitor electrode CE1 with the buffer layer 111 and/or the gate insulating layer 113 (e.g., the fourth insulating pattern 113$d$) therebetween, and form a capacitor. The buffer layer 111 and/or the gate insulating layer 113 (e.g., the fourth insulating pattern 113$d$) may serve as a dielectric layer of the storage capacitor Cst.

The buffer layer 111 may include a first portion 111$a$ and a second portion 111$b$, the first portion 111$a$ being between the first lower electrode 101 and the semiconductor layer Act, and the second portion 111$b$ being between the first capacitor electrode CE1 and the second capacitor electrode CE2. A second thickness $t_b$ of the second portion 111$b$ of the buffer layer 111 may be less than a first thickness $t_a$ of the first portion 111$a$. According to an embodiment, because the thickness of the buffer layer 111, which is a dielectric layer disposed between the first capacitor electrode CE1 and the second capacitor electrode CE2, is reduced, the performance of the storage capacitor Cst may be improved.

As an example, though it is shown in FIGS. 5 and 6 that the buffer layer 111 includes the recess portion RCE, the buffer layer 111 may not include the recess portion RCE. As an example, though it is shown in FIGS. 5 and 6 that the buffer layer 111 includes the recess portion RCE, the buffer layer 111 may not include the recess portion RCE. As an example, a portion of the buffer layer 111 on the first capacitor electrode CE1 and/or the first lower electrode 101, may have a protruding shape, compared to a portion of the buffer layer 111 directly disposed on the upper surface of the substrate 100. In this case, though a thickness of the second portion 111$b$ of the buffer layer 111 is reduced, the buffer layer 111 may not include the recess portion RCE.

Hereinafter, the case where the buffer layer 111 includes the recess portion RCE is described in detail.

The buffer layer 111 may include the recess portion RCE overlapping the first capacitor electrode CE1. In an embodiment, the recess portion RCE may include at least one lateral surface RCEs and a bottom surface. In an embodiment, the first portion 111$a$ of the buffer layer 111 may be located between the upper surface of the first lower electrode 101 and the lower surface of the semiconductor layer Act. The second portion 111$b$ of the buffer layer 111 may be a portion under the recess portion RCE.

A first opening 1130P overlapping the recess portion RCE of the buffer layer 111 may be defined in the gate insulating layer 113. As an example, the first opening 1130P overlapping the recess portion RCE may be defined in the fourth insulating pattern 113$d$.

The second capacitor electrode CE2 may be disposed in the first opening 1130P of the fourth insulating pattern 113$d$ and the recess portion RCE of the buffer layer 111. In other words, the second capacitor electrode CE2 may be continuously disposed on the upper surface of the fourth insulating pattern 113$d$, a lateral surface 113$ds$ of the first opening 1130P, the lateral surface RCEs, and the bottom surface of the recess portion RCE.

The second thickness t$_b$ of the second portion 111$b$ of the buffer layer 111 under the recess portion RCE may be less than the first thickness t$_a$ of the first portion 111$a$. The second thickness t$_b$ may denote a vertical distance from the upper surface of the first capacitor electrode CE1 to the bottom surface of the recess portion RCE in a Z-direction. That is, the second thickness t$_b$ may denote a vertical distance from the upper surface of the first capacitor electrode CE1 to the lower surface of the second capacitor electrode CE2 disposed on the bottom surface of the recess portion RCE. The first thickness t$_a$ may denote a vertical distance from the upper surface of the first lower electrode 101 to the upper surface of the first portion 111$a$ in the Z-direction.

As a comparative example, in the case where the buffer layer 111 does not include the recess portion RCE, the thickness of the second portion 111$b$ of the buffer layer 111 that serves as a dielectric layer, may be substantially equal to the thickness of the first portion 111$a$. In this case, it may be difficult that the storage capacitor Cst having a single capacitor structure sufficiently secures a capacitance.

In contrast, according to an embodiment, because the buffer layer 111 includes the recess portion RCE, the second thickness t$_b$ of the second portion 111$b$ of the buffer layer 111 under the recess portion RCE may be reduced, compared to the first thickness t$_a$ of the first portion 111$a$. That is, the thickness of a portion of the dielectric layer disposed between the first capacitor electrode CE1 and the second capacitor electrode CE2 may be reduced, and a capacitance of the storage capacitor Cst may increase. Accordingly, the storage capacitor Cst may secure a high capacitance with a single capacitor structure including the first capacitor electrode CE1 and the second capacitor electrode CE2.

At least a portion of the gate insulating layer 113 may be located between the lower surface of the second capacitor electrode CE2 and the upper surface of the buffer layer 111. As an example, at least a portion of the fourth insulating pattern 113$d$ may be located between the lower surface of the second capacitor electrode CE2 and the upper surface of the buffer layer 111. In an embodiment, at least a portion of the fourth insulating pattern 113$d$ may be disposed under an edge portion of the second capacitor electrode CE2.

In an embodiment, the lateral surface 113$ds$ of the first opening 1130P of the fourth insulating pattern 113$d$ may be located on the same inclined surface as the lateral surface RCEs of the recess portion RCE of the buffer layer 111. As described below with reference to FIG. 13, the first opening 1130P of the fourth insulating pattern 113$d$, and the recess portion RCE of the buffer layer 111 may be simultaneously formed during the same etching process. The lateral surface 113$ds$ of the first opening 1130P, and the lateral surface RCEs of the recess portion RCE may be located on the same etched surface. The lateral surface 113$ds$ of the first opening 1130P, and the lateral surface RCEs of the recess portion RCE may be formed without a step difference. The lateral surface 113$ds$ of the first opening 1130P, and the lateral surface RCEs of the recess portion RCE may be formed without a boundary.

In an embodiment, the storage capacitor Cst may be provided separately, not overlapping the thin-film transistor TFT. Though it is shown in FIG. 5 that the storage capacitor Cst is spaced apart from the thin-film transistor TFT, the embodiment is not limited thereto. In an embodiment, the storage capacitor Cst may overlap the thin-film transistor TFT.

An interlayer insulating layer 115 may be provided to cover the semiconductor layer Act, the gate electrode G, the second capacitor electrode CE2, the third wiring 130, the fourth wiring 140, and the pad electrode 150. In an embodiment, the interlayer insulating layer 115 may expose at least a portion of the pad portion PAD. As an example, an opening 1150P of the interlayer insulating layer 115 may expose a portion of the pad electrode 150. The interlayer insulating layer 115 may include silicon oxide, silicon nitride, silicon oxynitride, aluminum oxide, titanium oxide, tantalum oxide, hafnium oxide, or zinc oxide.

A planarization layer 117 may be disposed on the interlayer insulating layer 115. The planarization layer 117 may be disposed to expose the outer portion of the display panel. The planarization layer 117 may expose the pad portion PAD. That is, the planarization layer 117 may not overlap the pad portion PAD in the non-display area NDA. As a comparative example, in the case where the planarization layer 117 is disposed outside the display panel, the planarization layer 117 may serve as a transmission path of external moisture, and cause deterioration of a light-emitting element. The pad portion PAD, at least a portion of which is exposed and not covered by the interlayer insulating layer 115 and the planarization layer 117, may be electrically connected to a flexible printed circuit board.

The planarization layer 117 may include a single layer or a multi-layer including an organic material. The planarization layer 117 may include, for example, a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The planarization layer 117 may include a single layer or a multi-layer including the above materials.

A fifth contact hole configured to connect the thin-film transistor TFT to a pixel electrode 310 is defined in the interlayer insulating layer 115 and the planarization layer 117. The organic light-emitting diode OLED may be disposed on the planarization layer 117. The organic light-emitting diode OLED may include the pixel electrode 310, an emission layer 320, and an opposite electrode 330.

The pixel electrode 310 may be connected to the first electrode E1 through the fifth contact hole CNT5 passing through the interlayer insulating layer 115 and the planarization layer 117. The pixel electrode 310 may be a (semi) light-transmissive electrode or a reflective electrode. In an embodiment, the pixel electrode 310 may include a reflective layer and a transparent or semi-transparent electrode layer on the reflective layer, wherein the reflective layer includes at least one of Ag, Mg, Al, Pt, Pd, Au, Ni, Nd, Ir, Cr, and compound thereof. The pixel electrode 310 may include a transparent or semi-transparent electrode layer including indium tin oxide (ITO), indium zinc oxide (IZO), zinc oxide (ZnO), indium oxide (In$_2$O$_3$), indium gallium oxide (IGO), or aluminum zinc oxide (AZO). The pixel electrode 310 may be provided as a single layer, a double layer, or more.

A bank layer 190 may be disposed on the planarization layer 117. The bank layer 190 may cover the edges of the pixel electrode 310 and have an opening 1900P that exposes a portion of the pixel electrode 310. The bank layer 190 may prevent arcs and the like from occurring at the edges of the first electrode 310 by increasing a distance between the edges of the pixel electrode 310 and the opposite electrode 330 over the pixel electrode 310.

The bank layer 190 may include at least one organic insulating material from among polyimide, acrylic resin, benzocyclobutene, phenolic resin, and the like.

The emission layer 320 may be disposed on the pixel electrode 310. The emission layer 320 may overlap the opening 1900P of the bank layer 190. The emission layer 320 may include a low-molecular weight material or a polymer material, and emit red, green, blue, or white light. In an embodiment, the emission layer 320 may be patterned to correspond to each of the plurality of pixel electrodes 310. In an embodiment, the emission layer 320 may be formed as one body over the plurality of pixel electrodes 310.

In an embodiment, a hole injection layer (HIL) and/or a hole transport layer (HTL) may be disposed between the pixel electrode 310 and the emission layer 320.

The opposite electrode 330 may be disposed on the emission layer 320. The opposite electrode 330 may include a conductive material having a low work function. As an example, the opposite electrode 330 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or an alloy thereof. Alternatively, the opposite electrode 330 may further include a layer on the (semi) transparent layer, the layer including ITO, IZO, ZnO, or In$_2$O$_3$. In an embodiment, the opposite electrode 330 may be disposed to cover the display area DA entirely.

In an embodiment, an electron transport layer (ETL) and/or an electron injection layer (EIL) may be disposed between the emission layer 320 and the opposite electrode 330.

Because the organic light-emitting diode OLED may be easily damaged by external moisture, oxygen, or the like, the encapsulation layer 400 may be disposed to cover and protect the organic light-emitting diode OLED. The encapsulation layer 400 may include at least one organic encapsulation layer and at least one inorganic encapsulation layer. As an example, the encapsulation layer 400 may include a first inorganic encapsulation layer 410, a second inorganic encapsulation layer 430, and an organic encapsulation layer 420, which is disposed between the inorganic encapsulation layer 410 and the second inorganic encapsulation layer 430.

Each of the first and second inorganic encapsulation layers 410 and 430 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The organic encapsulation layer 420 may include a polymer-based material. The polymer-based material may include acryl-based resin, epoxy-based resin, polyimide, and polyethylene. As an example, the organic encapsulation layer 420 may include acrylic resin, such as polymethyl methacrylate or polyacrylic acid. The organic encapsulation layer 420 may be formed by hardening a monomer or coating a polymer.

The first dam DM1 and the second dam DM2 may be arranged in the non-display area NDA. In an embodiment, the first dam DM1 and the second dam DM2 may be disposed between the display area DA and the pad portion PAD. The first dam DM1 may be apart from the second dam DM2. The second dam DM2 may be arranged between the first dam DM1 and the pad portion PAD. Though it is shown in FIG. 5 that two dams are provided, the embodiment is not limited thereto.

The first dam DM1 and the second dam DM2 may overlap at least a portion of the signal lines and/or the power supply line. As an example, the first dam DM1 may overlap the first wiring 103 and third wiring 130. The second dam DM2 may overlap the second wiring 104 and the fourth wiring 140.

In an embodiment, the first dam DM1 may include a first planarization portion 117P1 of the planarization layer 117 and a first bank portion 190P1 of the bank layer 190. The second dam DM2 may include a second planarization portion 117P2 of the planarization layer 117 and a second bank portion 190P2 of the bank layer 190. In another embodiment, some of the layers of the first dam DM1 and the second dam DM2 may be omitted.

The encapsulation layer 400 may be arranged to cover the display area DA, and a portion of the encapsulation layer 400 may extend to the non-display area NDA. The first dam DM1 and the second dam DM2 may prevent the material for forming the organic encapsulation layer 420 of the encapsulation layer 400 from overflowing to the edge of the substrate 100.

The organic encapsulation layer 420 may contact the inner surface of the first dam DM1 facing the display area DA. In this case, when the organic encapsulation layer 420 contacts the inner surface of the first dam DM1, it may be understood that the first inorganic encapsulation layer 420 is located between the organic encapsulation layer 420 and the first dam DM1, and the organic encapsulation layer 420 directly contacts the first inorganic encapsulation layer 410. The first inorganic encapsulation layer 410 and the second inorganic encapsulation layer 430 may be disposed on the first dam DM1 and the second dam DM2, and may extend to the edge of the substrate 100. In an embodiment, the ends of the first inorganic encapsulation layer 410 and the second inorganic encapsulation layer 430 may be located between the second dam DM2 and the pad portion PAD.

FIGS. 7A, 8A, 9, 10, 11, 12, 13, 14A, 15A, 16, 17A, 18, 19, 20, and 21 are cross-sectional views showing a method of manufacturing a display apparatus, according to an embodiment. In addition, FIGS. 7B, 8B, 14B, 15B, and 17B are corresponding plan views of the display apparatus taken along line A-A' of FIGS. 7A, 8A, 14A, 15A, and 17A viewed from above.

Figure 7A:
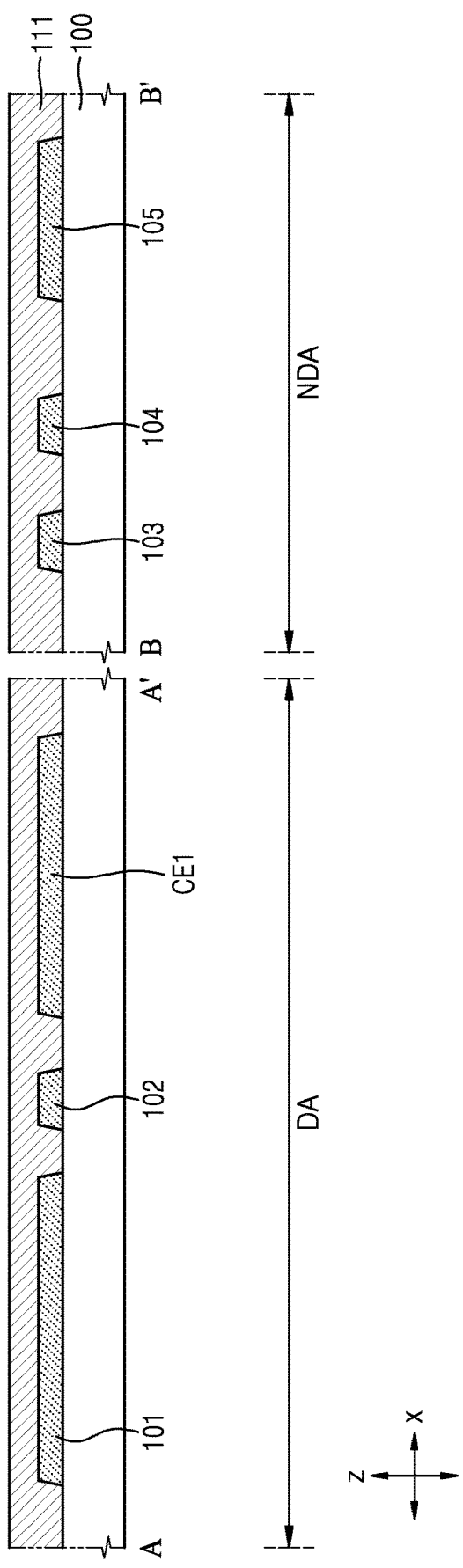
Figure 7B:
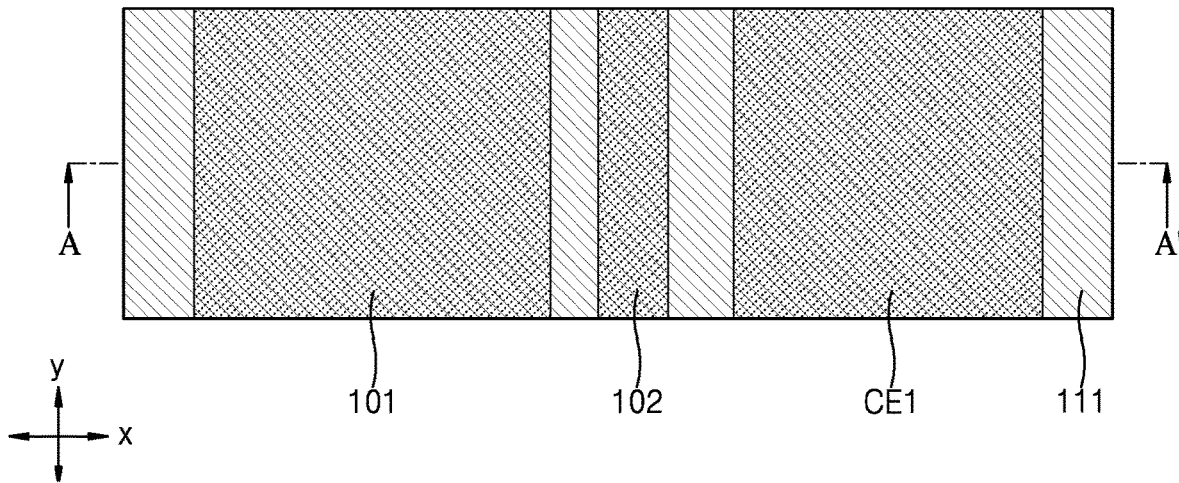
FIGS. 7B, 8B, 14B, 15B, and 17B are plan views of a display apparatus corresponding to FIGS. 7A, 8A, 14A, 15A, and 17A viewed from above.

Referring to FIGS. 7A and 7B, firstly, the first lower electrode 101, the second lower electrode 102, the first capacitor electrode CE1 of the storage capacitor Cst, the first wiring 103, the second wiring 104, and the auxiliary pad electrode 105 may be formed on the substrate 100. The first lower electrode 101, the second lower electrode 102, the first capacitor electrode CE1 of the storage capacitor Cst, the first wiring 103, the second wiring 104, and the auxiliary pad electrode 105 may be formed by patterning a preliminary conductive layer (not shown), and a photolithography process may be used in patterning the preliminary conductive layer.

Specifically, a photoresist pattern (not shown) may be formed by exposing and developing a photoresist layer (not shown) on the preliminary conductive layer (not shown) using a first mask. A photoresist may be a positive photoresist or a negative photoresist. The first lower electrode 101, the second lower electrode 102, the first capacitor electrode CE1 of the storage capacitor Cst, the first wiring 103, the second wiring 104, and the auxiliary pad electrode 105 may be formed by etching the preliminary conductive layer using a photoresist pattern as an etch mask, and removing the photoresist pattern.

The buffer layer 111 may be formed to cover the first lower electrode 101, the second lower electrode 102, the first capacitor electrode CE1 of the storage capacitor Cst, the first wiring 103, the second wiring 104, and the auxiliary pad electrode 105. The buffer layer 111 may be formed by a deposition method, such as chemical vapor deposition (CVD), thermal CVD (TCVD), plasma enhanced chemical vapor deposition (PECVD), sputtering, e-beam evaporation, and the like.

Figure 8A:
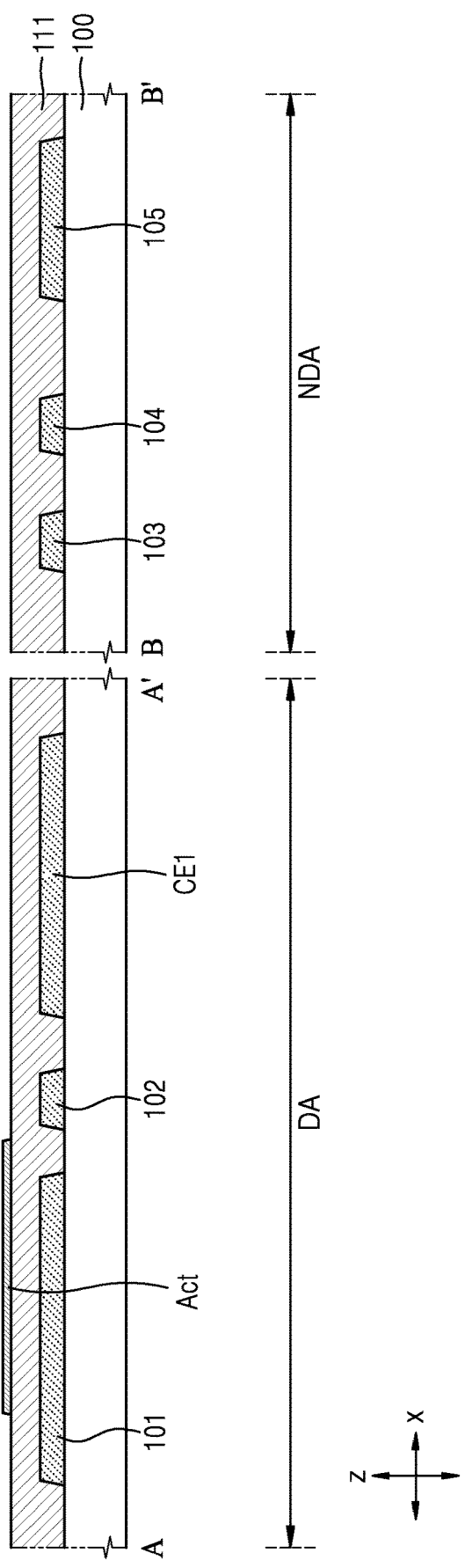
Figure 8B:
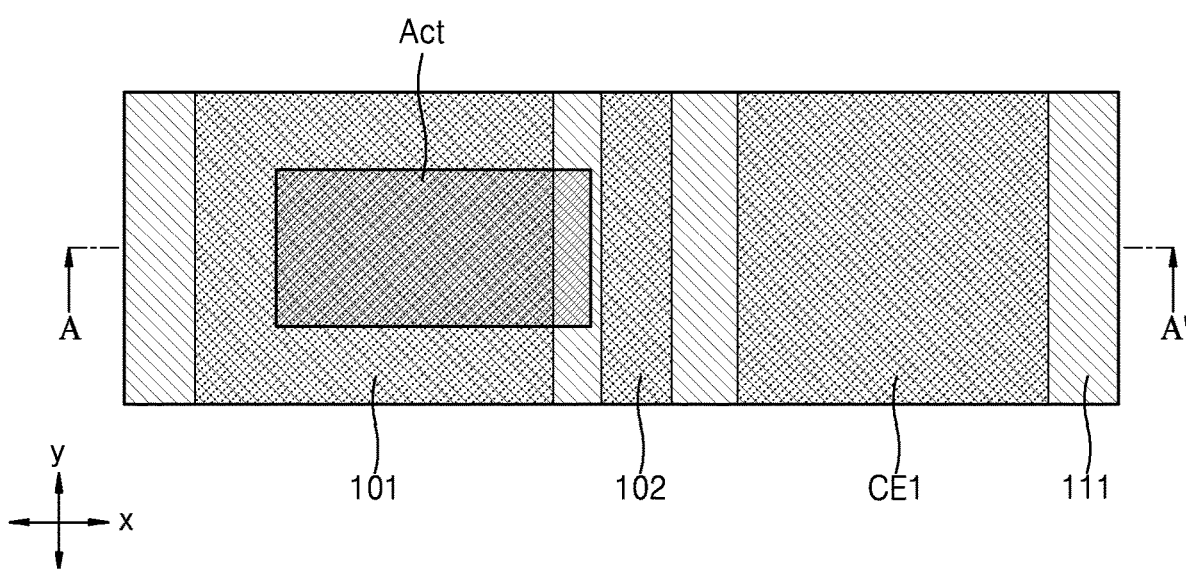
Figure 9:
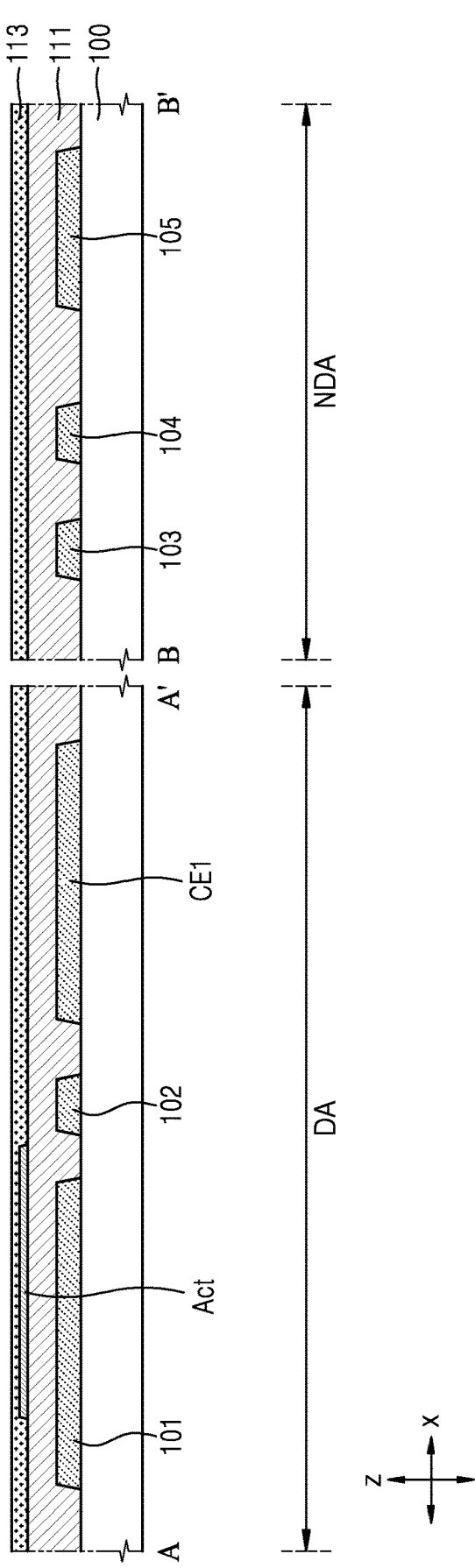
Figure 10:
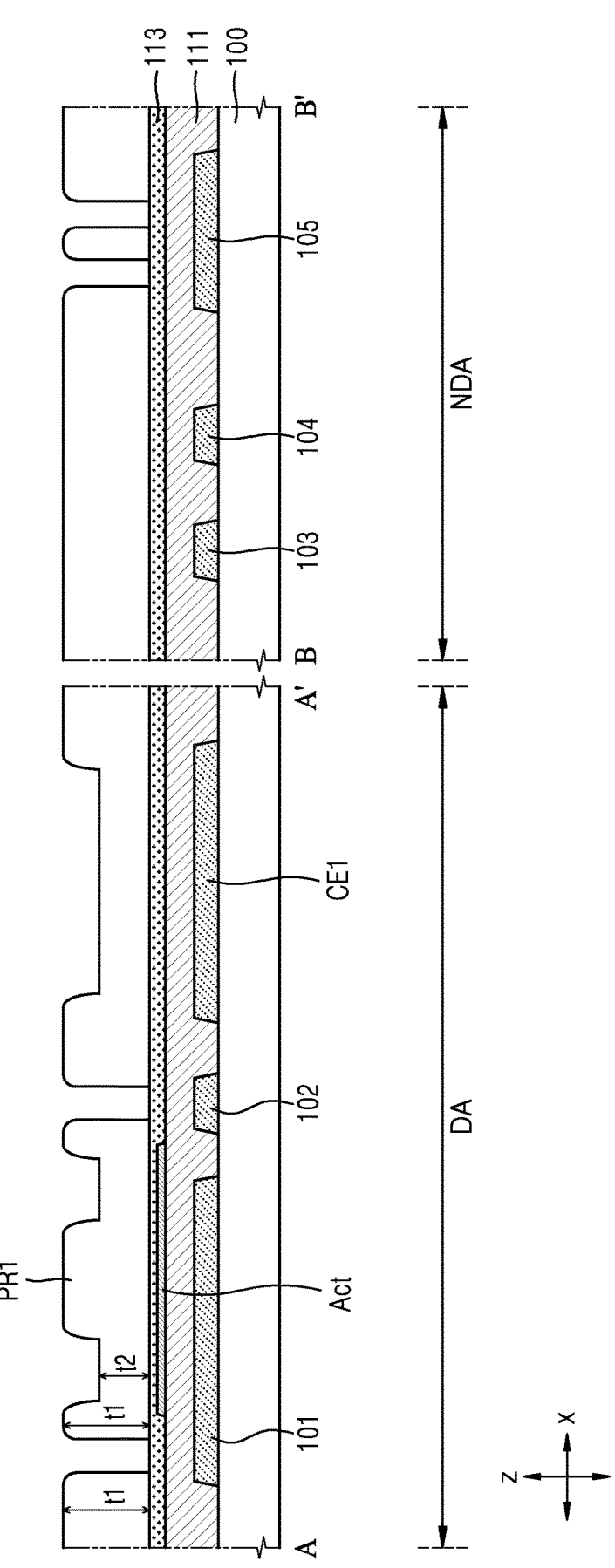

Referring to FIGS. 8A and 8B, the semiconductor layer Act may be disposed on the buffer layer 111. The semiconductor layer Act may be formed by patterning a preliminary semiconductor layer (not shown). A second mask including a pattern corresponding to the semiconductor layer Act may be used in forming the semiconductor layer Act. As an example, a photolithography process may be used. The preliminary semiconductor layer may include an oxide semiconductor, and be formed by using, for example, CVD.

Referring to FIGS. 9, 10, 11, 12, and 13, the gate insulating layer 113 may be formed on the semiconductor layer Act. The gate insulating layer 113 may be formed by a deposition method, such as chemical vapor deposition (CVD), thermal CVD (TCVD), plasma enhanced chemical vapor deposition (PECVD), sputtering, e-beam evaporation, and the like.

A first photoresist pattern PR1 may be formed on the gate insulating layer 113. The first photoresist pattern PR1 may include a portion that exposes the gate insulating layer 113, a first portion having a first thickness t1, and a second portion having a second thickness t2 less than the first thickness t1.

The first photoresist pattern PR1 may be formed by using a third mask (not shown). The third mask may be a half-tone mask or a slit mask. The half-tone mask or the slit mask may be divided into a transmissive region that transmits light, a semi-transmissive region that partially transmit light, and a non-transmissive region that blocks light according to a light transmittance. When a first photoresist layer (not shown) is coated, the first photoresist layer is exposed by using the third mask, and then developed, portions corresponding to the transmissive region and the semi-transmissive region may be removed by different thicknesses, and a portion corresponding to the non-transmissive region may remain without being removed. Each portion of the first photoresist pattern PR1 corresponding to different regions may have different thicknesses.

In this case, portions of the first photoresist pattern PR1 having a second thickness t2 may correspond to a region of the storage capacitor Cst (see FIG. 5) and the source region S (see FIG. 5) and the drain region D (see FIG. 5) of the semiconductor layer Act.

Figure 11:
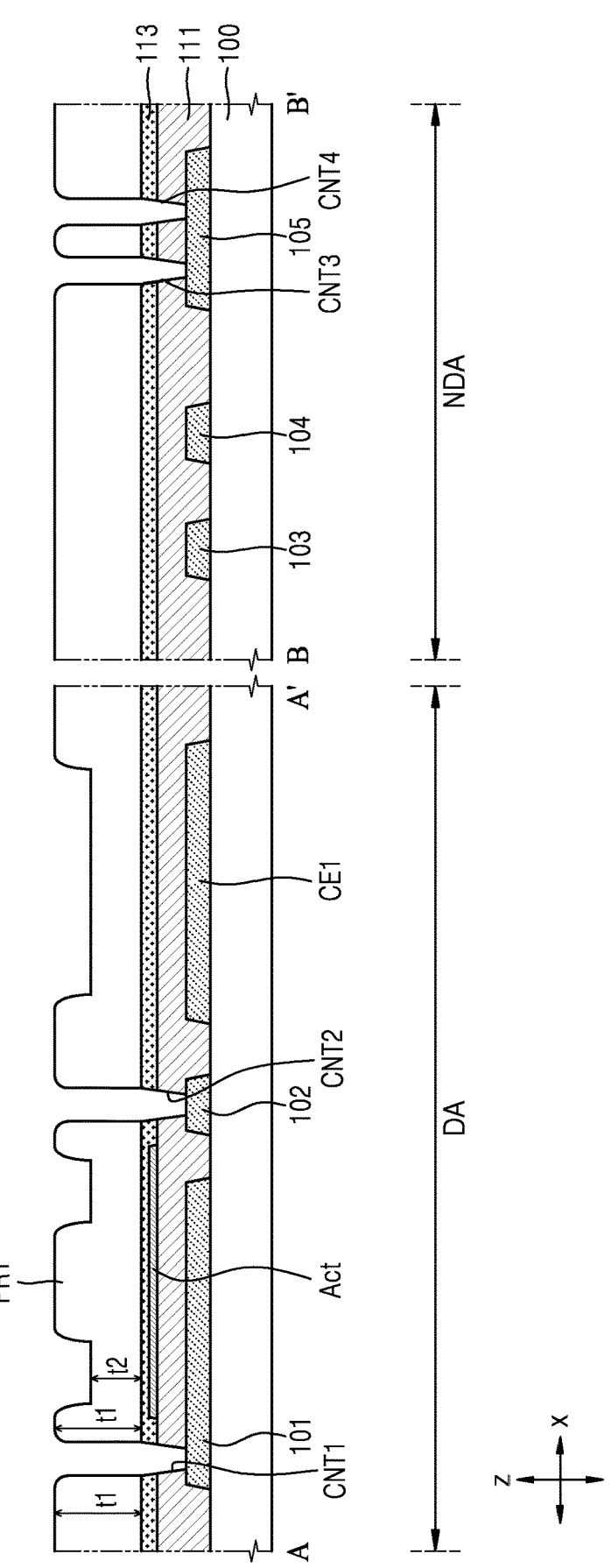

Referring to FIG. 11, the gate insulating layer 113 and the buffer layer 111 thereunder may be etched by using the first photoresist pattern PR1 as an etch mask. The gate insulating layer 113 and the buffer layer 111 may be partially removed. In this case, the etching process may be, for example, a dry etching process. The removed portions may be portions exposed by the first photoresist pattern PR1. A first contact hole CNT1, a second contact hole CNT2, a third contact hole CNT3, and a fourth contact hole CNT4 each passing through the gate insulating layer 113 and the buffer layer 111 may be formed.

Figure 12:
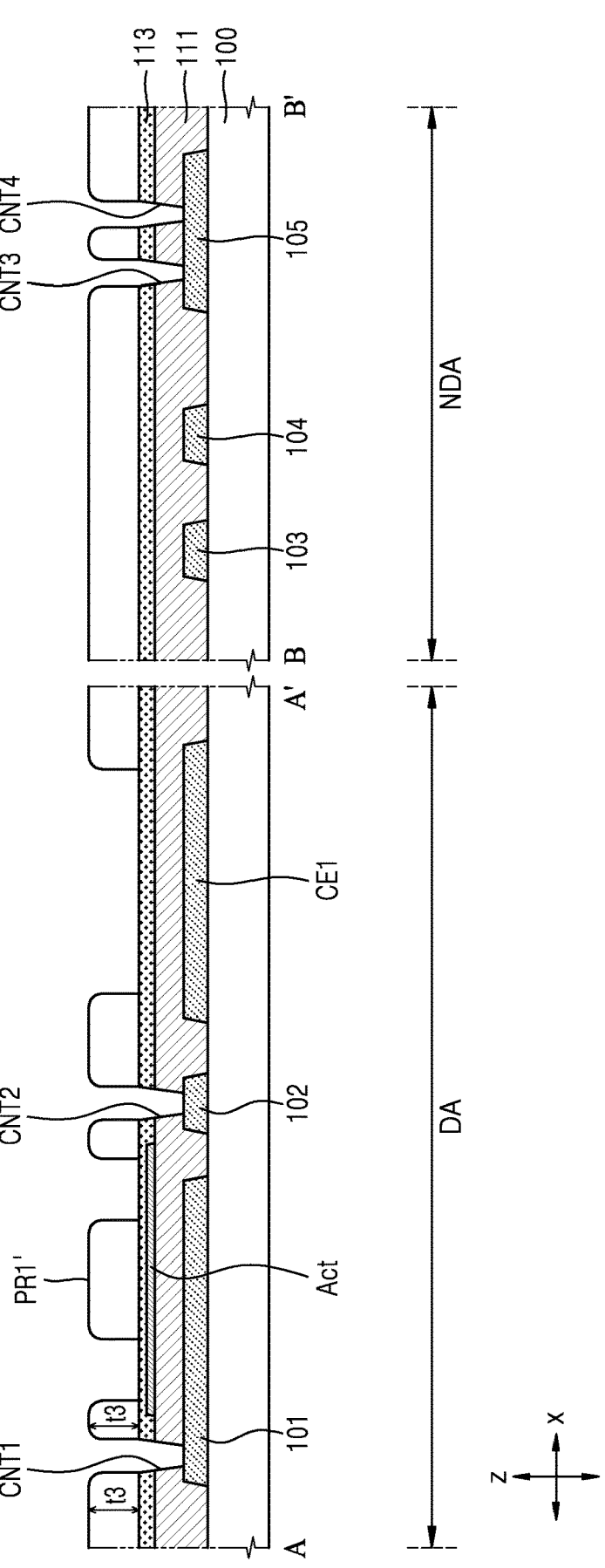

Referring to FIG. 12, a portion of the first photoresist pattern PR1 may be removed by performing an etching back process. As an example, an ashing process may be used. By the ashing process, the portions of the first photoresist pattern PR1 having the relatively small second thickness t2 may be completely removed, and the portions having the relatively thick first thickness t1 may be partially removed and may remain by a third thickness t3. A first photoresist pattern PR1' that is transformed may be formed.

Figure 13:
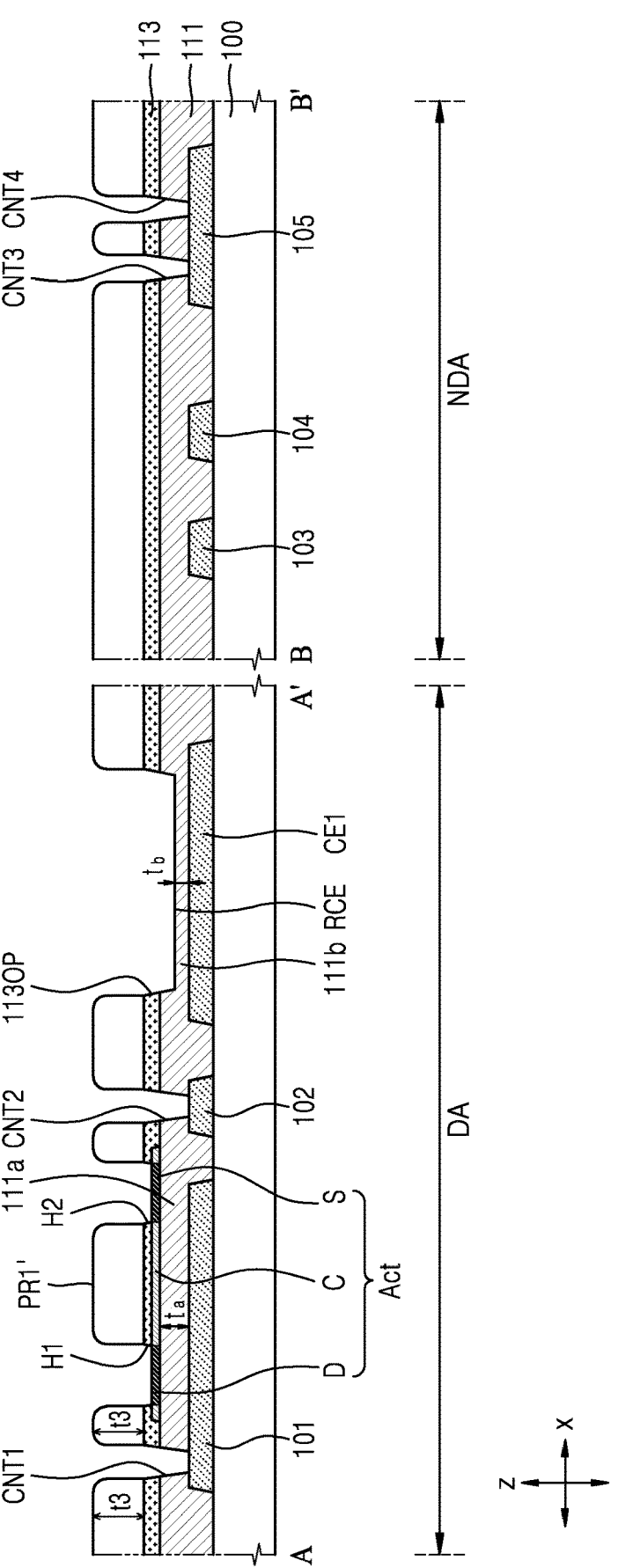

Referring to FIG. 13, the gate insulating layer 113 and/or the buffer layer 111 may be etched by using the first photoresist pattern PR1' that is transformed as an etch mask. The gate insulating layer 113 and/or the buffer layer 111 may be partially removed. In this case, the etching process may be, for example, a dry etching process. The removed portion may correspond to a portion of the first photoresist pattern PR1 before the transformation that has the second thickness t2 in a portion exposed by the first photoresist pattern PR1' that is transformed.

In the etching process, a portion of the gate insulating layer 113 that overlaps the storage capacitor Cst may be removed, and the first opening 1130P may be formed. Simultaneously, a portion of the buffer layer 111 exposed by the first opening 1130P may be removed, and the recess portion RCE may be formed. That is, the first opening 1130P of the gate insulating layer 113 and the recess RCE of the buffer layer 111 may be formed in the same etching process. The second thickness $t_b$ of the second portion 111b of the buffer layer 111 overlapping the recess portion RCE and disposed under the recess portion RCE may be less than the first thickness $t_a$ of the first portion 111a of the buffer layer 111 disposed between the upper surface of the first lower electrode 101 and the lower surface of the semiconductor layer Act.

In addition, in the etching process, a portion of the gate insulating layer overlapping the semiconductor layer Act may be removed, and a first hole H1 and a second hole H2 may be formed.

As a comparative example, the first opening, the recess portion, the first hole, and the second hole included in the gate insulating layer and/or the buffer layer thereunder may be formed in the same process as a process of forming the first contact hole and the second contact hole. In this case, for example, while the first contact hole and the second contact hole are formed to pass through the gate insulating layer and the buffer layer, the first hole and the second hole are formed to a relatively shallow depth passing through only the gate insulating layer. Accordingly, excessive etching may occur in the first hole and the second hole. Accordingly, the thickness of the semiconductor layer exposed by the first hole and the second hole may be reduced, and thus, a loss of the semiconductor layer may occur. In addition, because the recess portion is formed by removing only a portion of the buffer layer in the thickness direction, it may be difficult to control the recess portion to be formed to a target depth without removing the buffer layer entirely.

In contrast, according to an embodiment, the first opening 1130P, the recess portion RCE, the first hole H1, and the second hole H2 may be formed in an etching process which is different from the process of forming the first contact hole CNT1 and the second contact hole CNT2. Specifically, the first contact hole CNT1 and the second contact hole CNT2 may be formed by using a first etching process that uses the first photoresist pattern PR1, and then the first opening 1130P, the recess portion RCE, the first hole H1, and the second hole H2 may be formed by using a second etching process PR' that is transformed. In this case, a loss of the semiconductor layer Act exposed by the first hole H1 and the second hole H2 may be reduced. As an example, in the case where the semiconductor layer Act is an oxide semiconductor and includes In GaZnO (IGZO), a remaining amount of IGZO included in the semiconductor layer Act may increase. In addition, the recess portion RCE of the buffer layer 111 may be easily formed in a desired shape.

Because the first opening 1130P of the gate insulating layer 113 and the recess portion RCE of the buffer layer 111 disposed thereunder may be formed to overlap the first capacitor electrode CE1, a capacitance disposed between the second capacitor electrode CE2 formed in a subsequent process and the first capacitor electrode CE1 may be improved.

Regions of the semiconductor layer Act exposed by the first hole H1 and the second hole H2 may be become conductive by a plasma treatment. The conductive regions may correspond to portions of the source region S and the drain region D of the semiconductor layer Act.

The plasma treatment is a process in which particles having high energy placed in a plasma state collide with the surface of a material, thereby changing the surface of the material chemically or materially. In an embodiment, in the plasma treatment, at least one of hydrogen gas, argon gas, helium gas, xenon gas, nitrogen gas, nitrogen oxide gas, oxygen gas, and a mixed gas thereof may be used.

When an oxide semiconductor is plasma-treated, the oxide semiconductor is reduced, and thus, an oxygen defect included in the oxide semiconductor is induced and oxygen vacancy increases. The oxide semiconductor with an increased oxygen vacancy has an increased carrier concentration, and consequently, the concentration of a threshold voltage, which is a critical voltage at which electricity is transferred, moves in a negative direction. This denotes that the oxide semiconductor becomes a conductor and conducts electricity well.

Figure 14A:
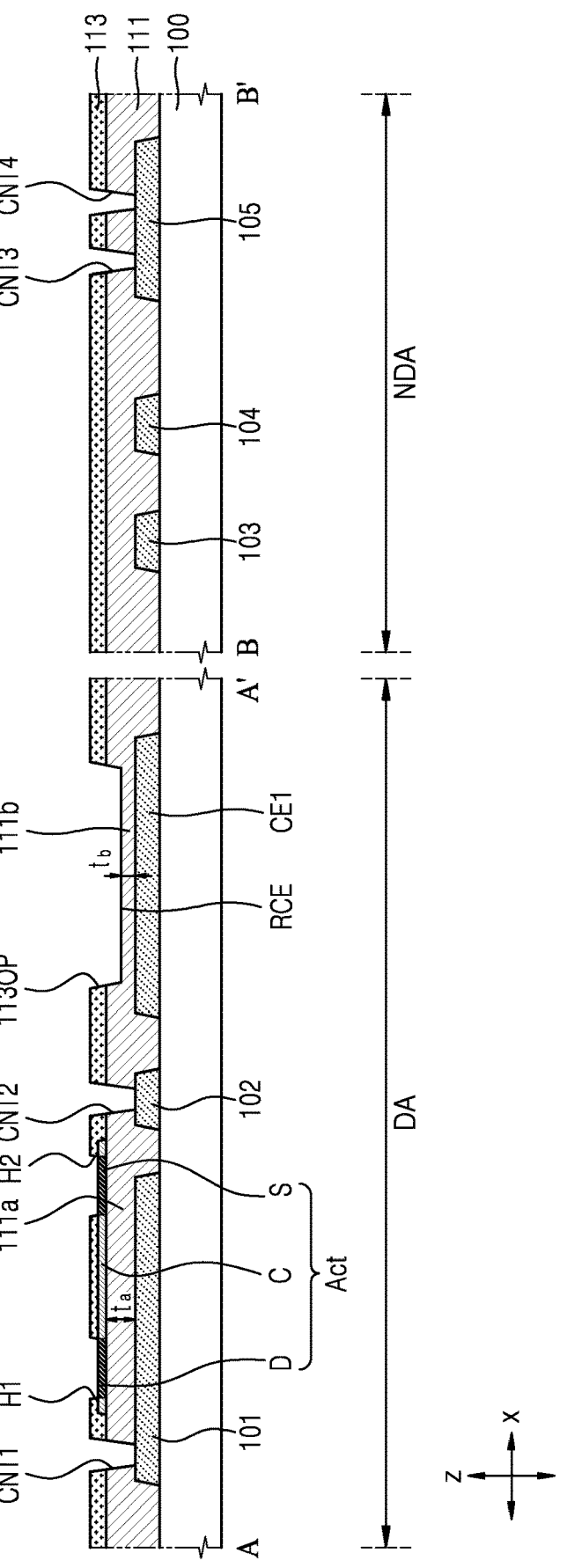
Figure 14B:
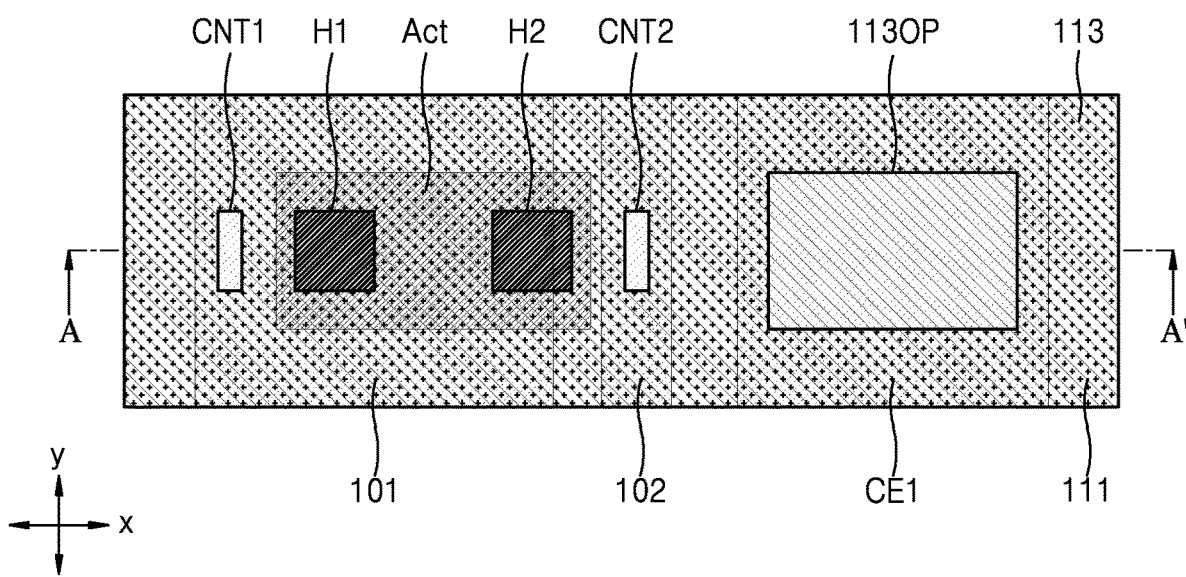

Referring to FIGS. 14A and 14B, the first photoresist pattern PR1' that is transformed, may be removed (e.g., stripped).

Figure 15A:
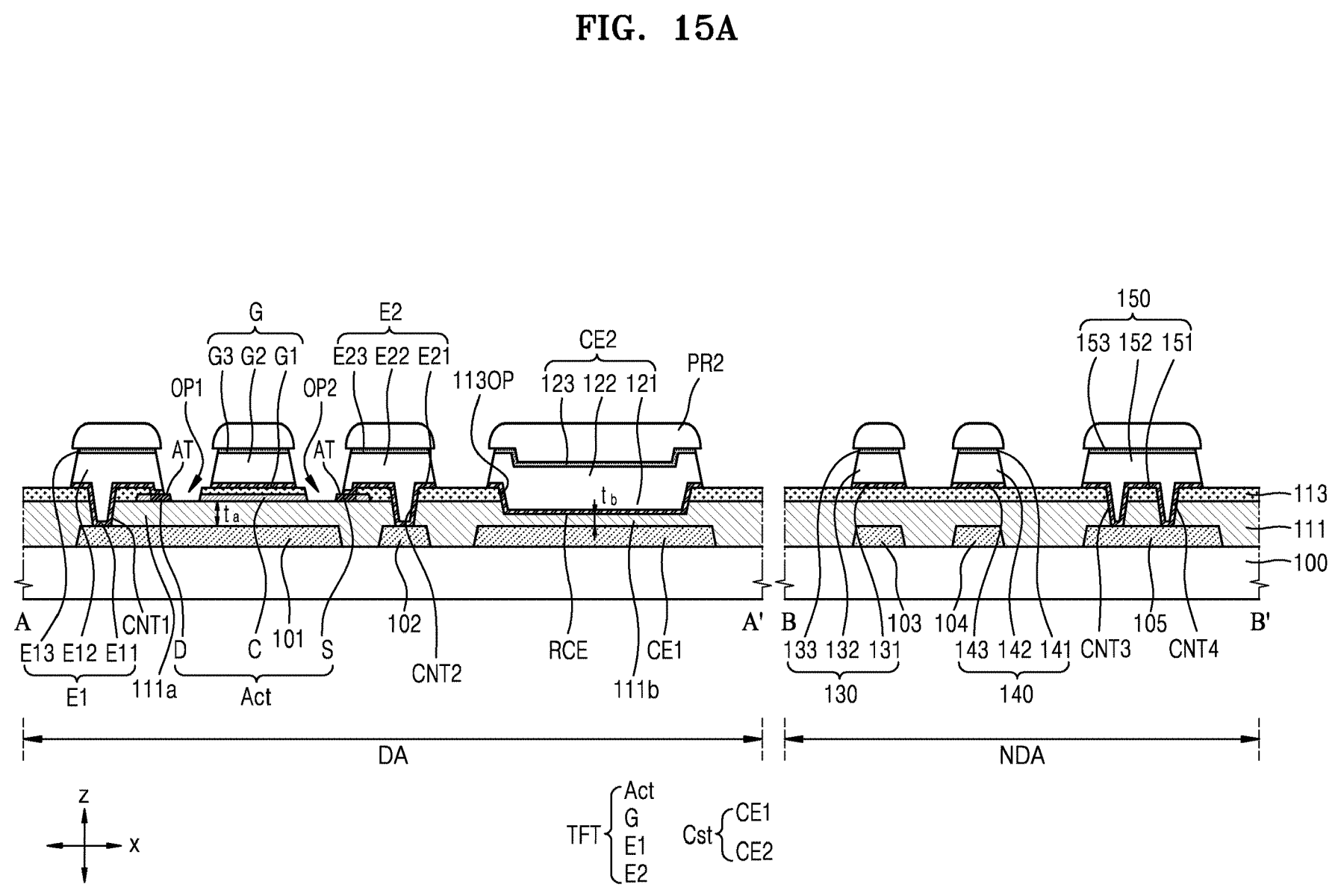
Figure 15B:
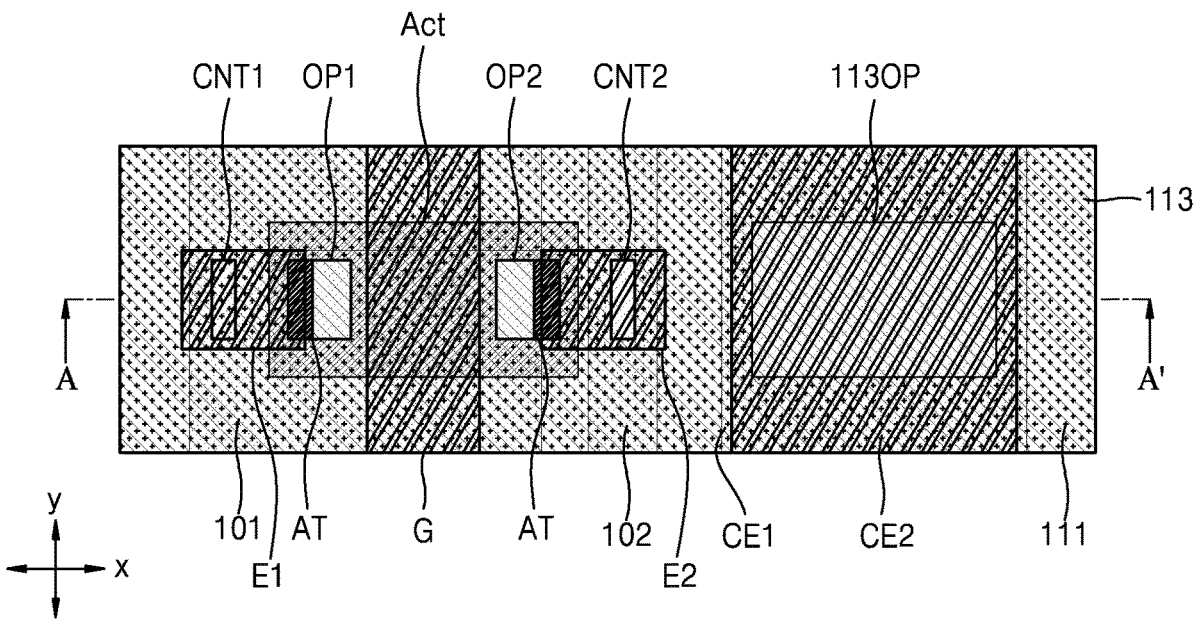

Referring to FIGS. 15A and 15B, the first electrode E1, the second electrode E2, the second capacitor electrode CE2 of the storage capacitor Cst, the third wiring 130, the fourth wiring 140, and the pad electrode 150 may be formed on the gate insulating layer 113. The first electrode E1, the second electrode E2, the second capacitor electrode CE2 of the storage capacitor Cst, the third wiring 130, the fourth wiring 140, and the pad electrode 150 may be formed by forming a preliminary electrode layer (not shown) and patterning the preliminary electrode layer (not shown) by using a second photoresist pattern PR2. The second photoresist pattern PR2 may be formed by using a fourth mask.

A preliminary metal layer may be formed by using a deposition method, such as chemical vapor deposition, plasma chemical vapor deposition, low pressure chemical vapor deposition, physical vapor deposition, sputtering, or atomic layer deposition.

The preliminary electrode layer may include a single conductive layer or a plurality of conductive layers. In an embodiment, the preliminary electrode layer may include a first sub-preliminary electrode layer, a second sub-preliminary electrode layer on the first sub-preliminary electrode layer, and a third sub-preliminary electrode layer on the second sub-preliminary electrode layer.

In an embodiment, the first to third sub-preliminary electrode layers may each include at least one of conductive materials including molybdenum (Mo), aluminum (Al), copper (Cu), titanium (Ti), and the like. In an embodiment, the first to third sub-preliminary electrode layers may each include a transparent conductive material. The transparent conductive material may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first and third sub-preliminary electrode layers may include titanium (Ti), and the second sub-preliminary electrode layer may include aluminum (Al).

Hereinafter, the case where the preliminary electrode includes three sub-preliminary electrode layers is described. As shown in FIG. 15A, first layers E11, E21, G11, 121, 131, 141, and 151, second electrode layers E12, E22, G12, 122, 132, 142, and 152, and third layers E13, E23, G13, 123, 133, 143, and 153 of the first electrode E1, the second electrode E2, the gate electrode G, the second capacitor electrode CE2 of the storage capacitor Cst, the third wiring 130, the fourth wiring 140, and the pad electrode 150, may correspond to the first to third sub-preliminary electrode layers of the preliminary electrode layer.

The second photoresist pattern PR2 may be formed on the preliminary electrode layer. The second photoresist pattern PR2 may be formed by coating a second photoresist layer and exposing and developing the second photoresist layer.

The preliminary electrode layer may be etched by using the second photoresist pattern PR2 as an etch mask. The first electrode E1, the second electrode E2, the gate electrode G, the second capacitor electrode CE2, the third wiring 130, the fourth wiring 140, and the pad electrode 150 may be formed by etching portions not protected by the second photoresist pattern PR2. As an example, the etching process may be a wet etching process. The etching may be performed twice with different etching solutions, or performed only once with the same etching solutions.

The first electrode E1, the second electrode E2, the gate electrode G, the second capacitor electrode CE2, the third wiring 130, the fourth wiring 140, and the pad electrode 150 may each include a plurality of sub-layers. The number of sub-layers and the materials of each of the first electrode E1, the second electrode E2, the gate electrode G, the second capacitor electrode CE2, the third wiring 130, the fourth wiring 140, and the pad electrode 150, may be the same.

A portion of at least a portion of the second capacitor electrode CE2 may be disposed in the recess portion RCE. As an example, the edge portion of the second capacitor electrode CE2 may be disposed on the upper surface of the gate insulating layer 113, and the inner portion of the second capacitor electrode CE2 surrounded by the edge portion may be disposed in the recess portion RCE.

In the etching process, a portion of the conductive region of the semiconductor layer Act exposed by the first hole H1 and the second hole H2 may be removed. The first opening OP1 and the second opening OP2 may be formed in the semiconductor layer Act. The buffer layer 111 may be exposed by the first opening OP1 and the second opening OP2. Portions of the conductive portion, which are not etched away, may overlap the first electrode E1 and the second electrode E2. The tail region AT adjacent to the first opening OP1 and the second opening OP2 may be connected to the conductive region of the semiconductor layer Act in a subsequent process.

Figure 16:
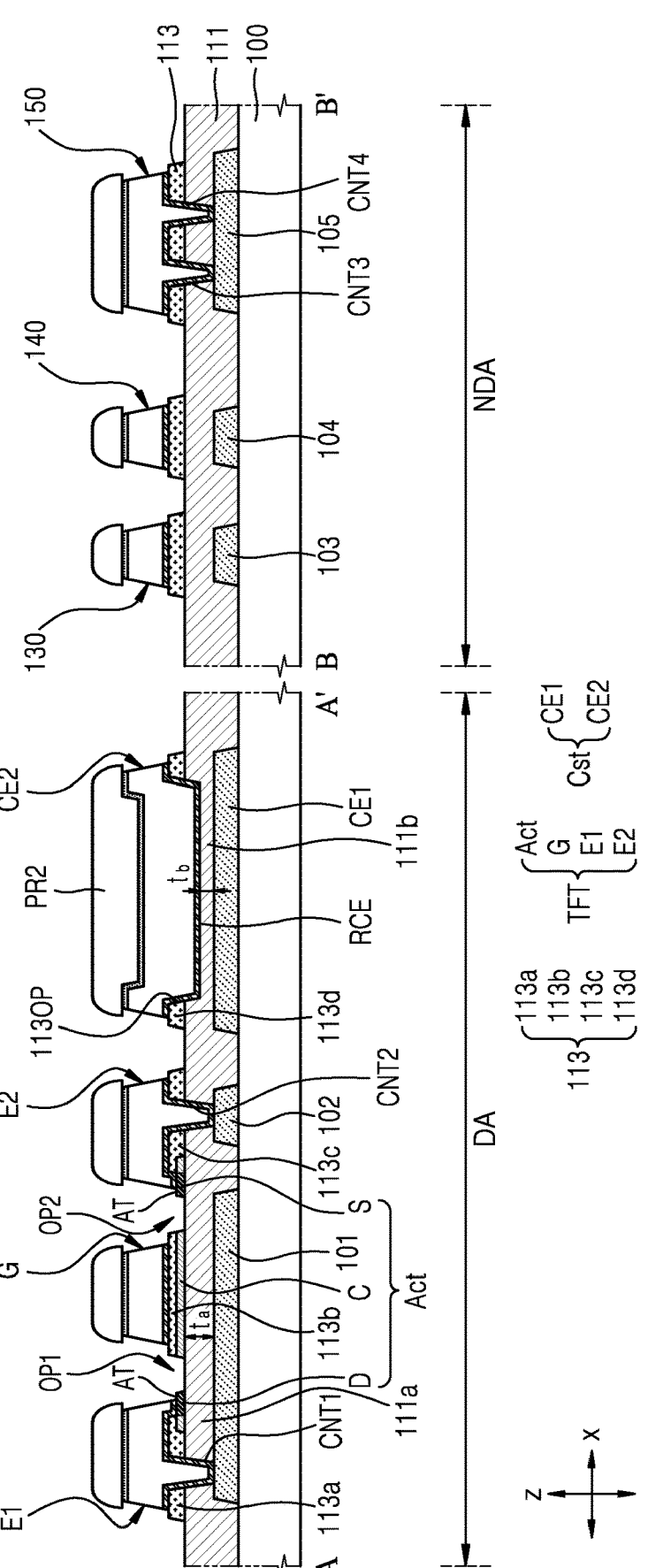

Referring to FIG. 16, a portion of the gate insulating layer 113 may be etched and patterned by using the second photoresist pattern PR2 as an etch mask. In this case, the etching may be, for example, dry etching. The gate insulating layer 113 that is patterned may include a first insulating pattern 113*a*, a second insulating pattern 113*b*, a third insulating pattern 113*c*, and a fourth insulating pattern 113*d*. The first to fourth insulating patterns 113*a*, 113*b*, 113*c*, and 113*d* may be spatially and physically separated from each other.

A portion of the semiconductor layer Act exposed without being covered by the gate insulating layer 113 that is patterned, for example, the first insulating pattern 113*a*, the second insulating pattern 113*b*, the third insulating pattern 113*c*, and the fourth insulating pattern 113*d*, may become conductive by a plasma treatment.

Figure 17A:
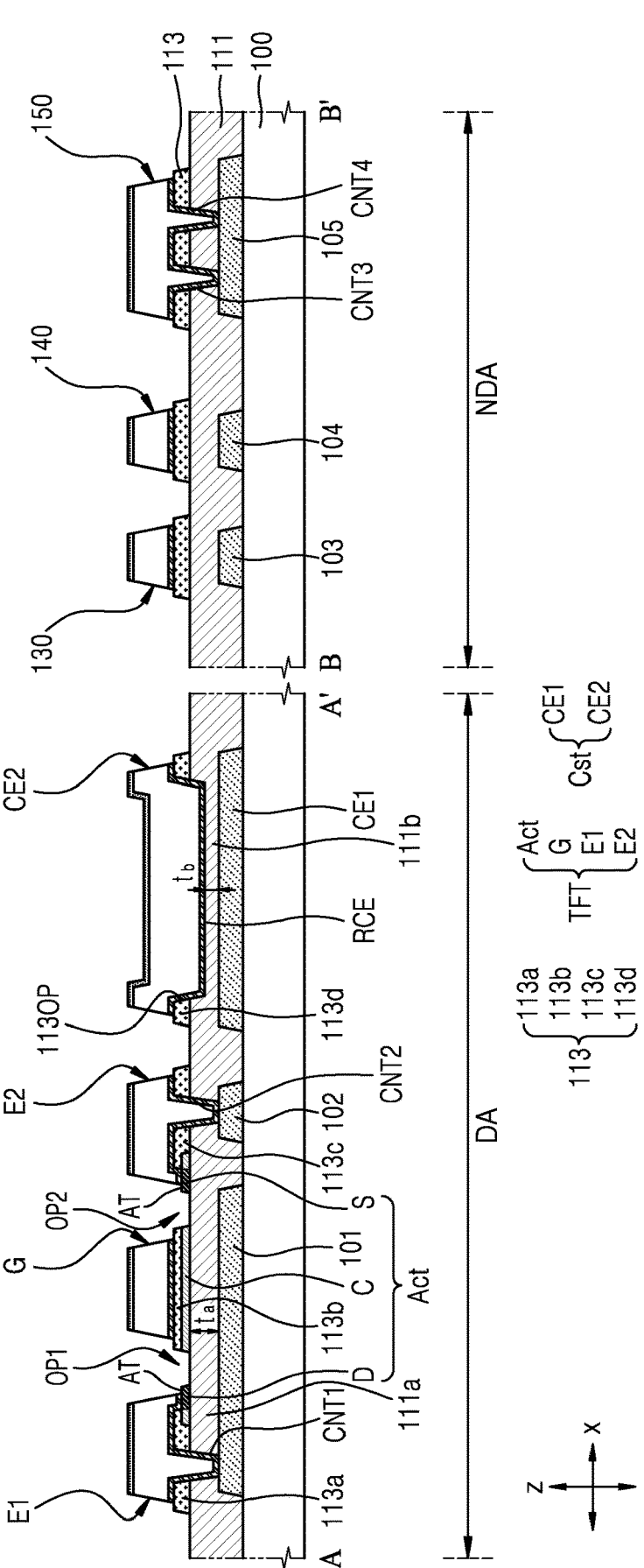
Figure 17B:
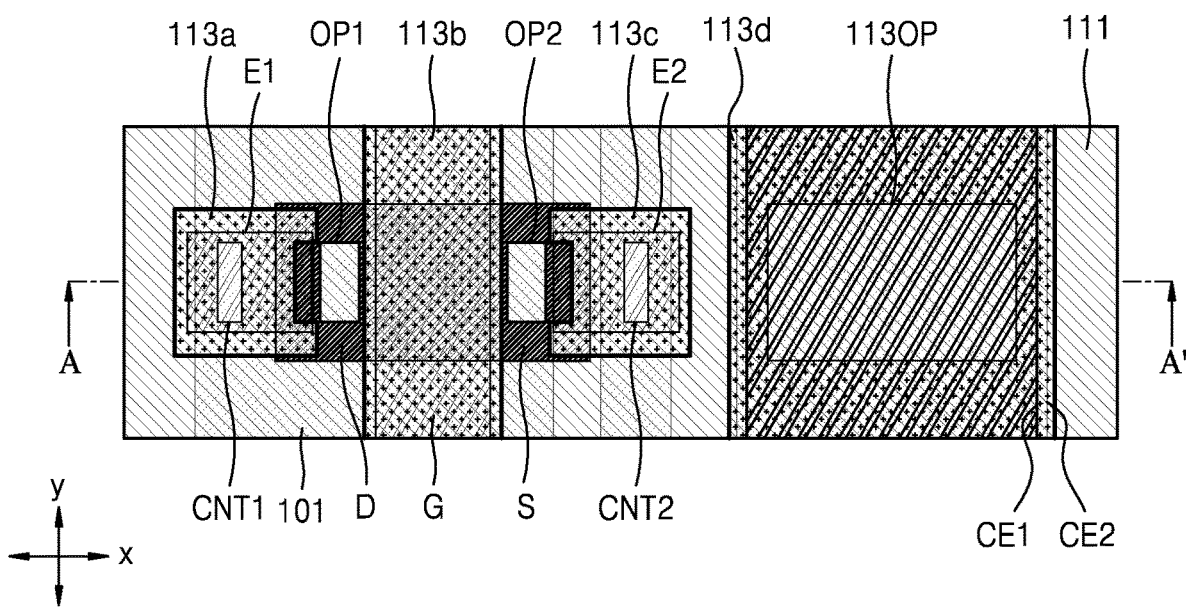

Referring to FIGS. 17A and 17B, the second photoresist pattern PR2 may be removed (e.g., stripped).

Figure 18:
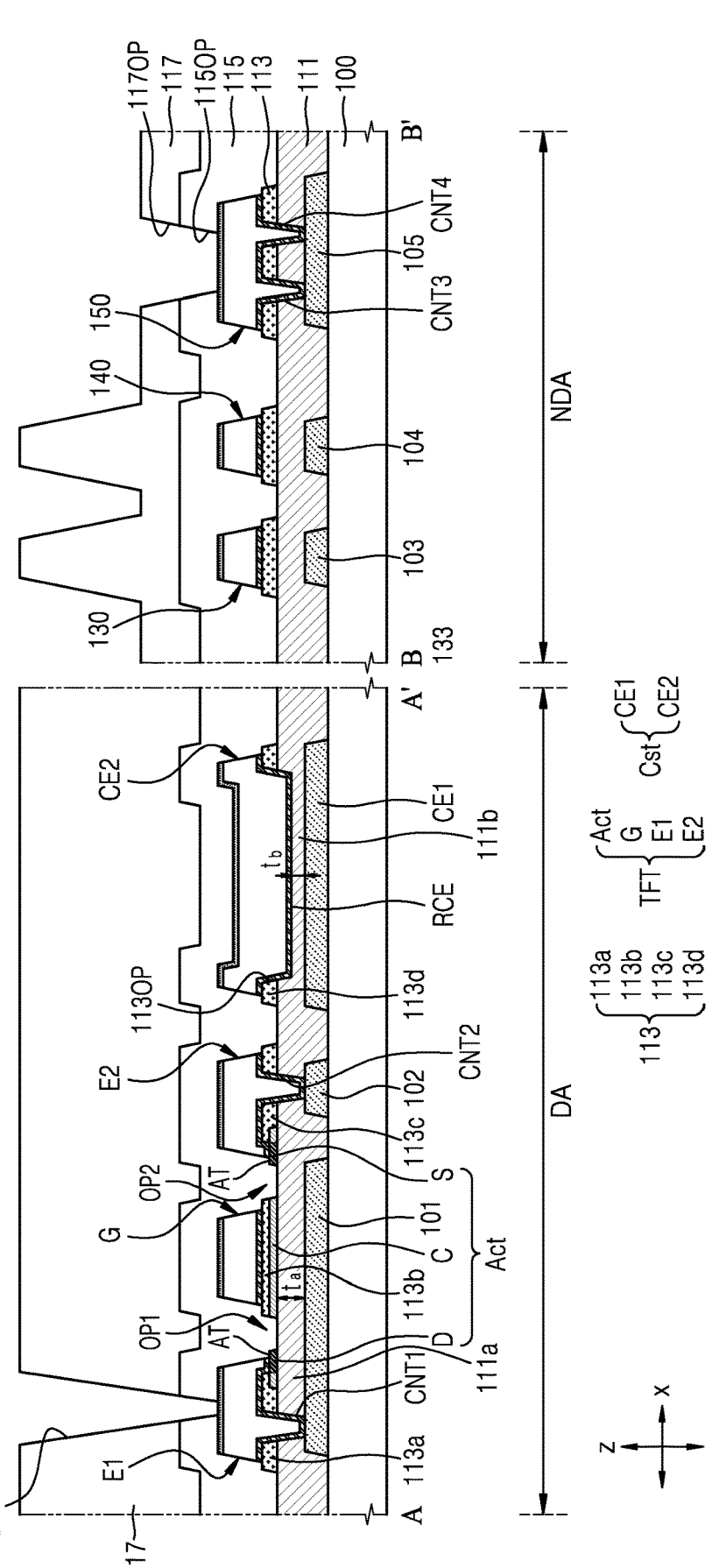

Referring to FIG. 18, the interlayer insulating layer 115 may be formed to cover the semiconductor layer Act, the gate electrode G, the second capacitor electrode CE2, the third wiring 130, the fourth wiring 140, and the pad electrode 150. The interlayer insulating layer 115 may be formed by a deposition method, such as chemical vapor deposition (CVD), thermal CVD (TCVD), plasma enhanced chemical vapor deposition (PECVD), sputtering, e-beam evaporation, and the like.

The planarization layer 117 may be formed on the interlayer insulating layer 115. A fifth mask including a pattern corresponding to an opening 1170P may be used in forming the planarization layer 117. As an example, a photolithography process may be used. In an embodiment, the fifth mask may be a half-tone mask or a slit mask. The planarization layer 117 may be formed by coating a preliminary planarization layer 117, exposing and developing the preliminary planarization layer 117 using the fifth mask. The opening 1170P of the planarization layer 117 may be formed to overlap the pad portion PAD. A contact hole of the planarization layer 117 may be formed to overlap the first electrode E1.

The planarization layer 117 may be formed to a relatively small thickness in at least a partial region of the non-display area NDA except the first dam DM1 and the second dam DM2. The planarization layer in the relevant region may be removed in the subsequent process.

Then, the interlayer insulating layer 115 may be etched. In this case, the etching may be, for example, dry etching. The opening 1150P of the interlayer insulating layer 115, and a fifth contact hole CNT5 exposing the first electrode E1 may be formed. The opening 1150P of the interlayer insulating layer 115 may overlap the opening 1170P of the planarization layer 117. The opening 1150P of the interlayer insulating layer 115 may expose the pad electrode 150.

Figure 19:
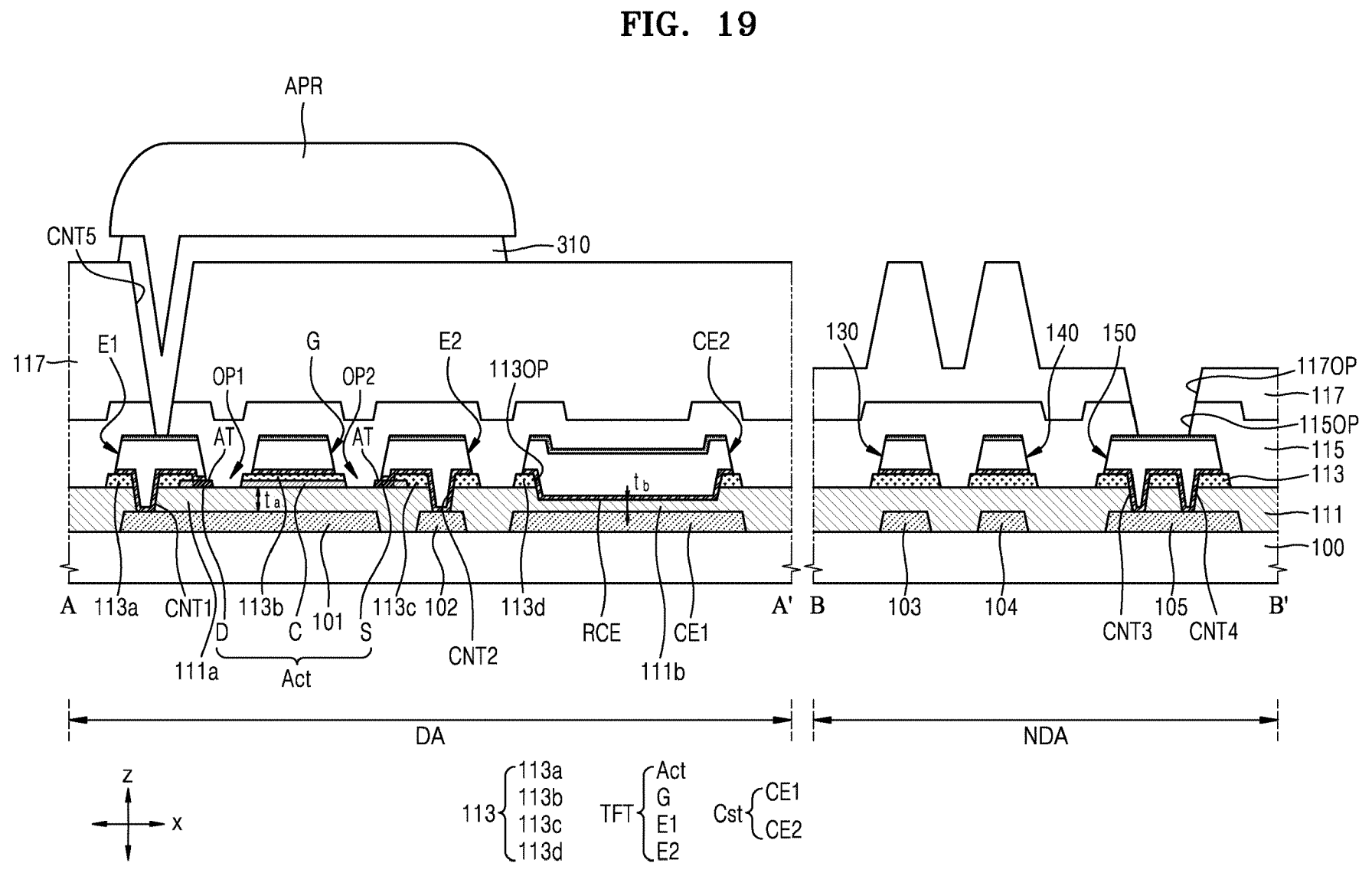

Referring to FIG. 19, the pixel electrode 310 may be formed on the planarization layer 117. A sixth mask including a pattern corresponding to the pixel electrode 310 may be used in forming the pixel electrode 310. As an example, a photolithography process may be used.

An anode photoresist pattern APR may be formed on a preliminary pixel electrode layer. The anode photoresist pattern APR may be formed by using the sixth mask. The pixel electrode 310 may be formed by etching the preliminary pixel electrode layer using the anode photoresist pattern APR as an etch mask. The pixel electrode 310 may be connected to the first electrode E1 of the thin-film transistor TFT through the fifth contact hole CNT5 formed in the planarization layer 117 and the interlayer insulating layer 115.

Figure 20:
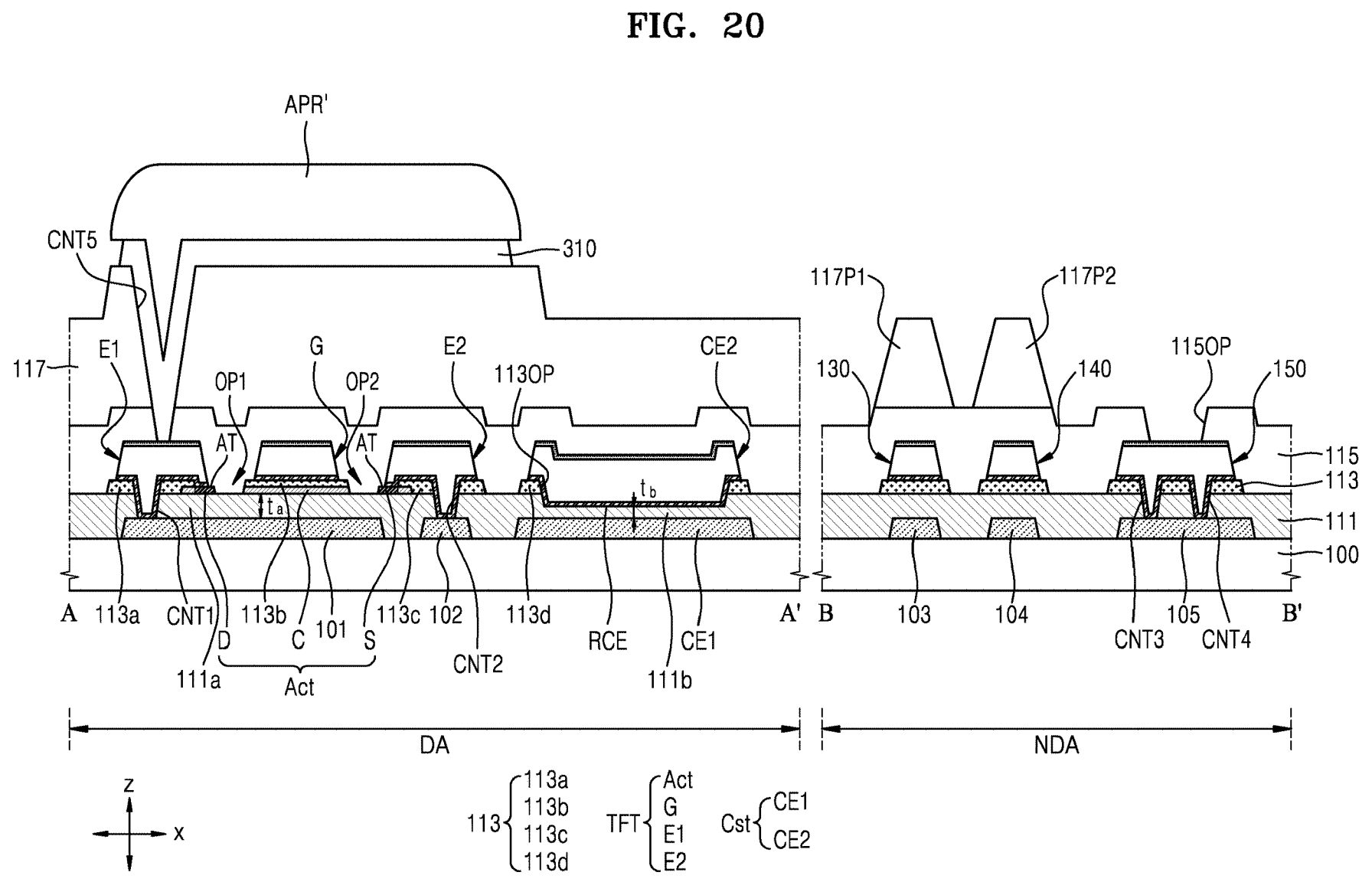

Referring to FIG. 20, the anode photoresist pattern APR and the planarization layer 117 may be partially removed. As an example, an ashing process may be used. The thickness of the anode photoresist pattern APR may be reduced by the ashing, and thus, an anode photoresist pattern APR' that is transformed may be formed. A portion of the planarization layer 117 that overlaps the non-display area NDA may be completely removed. In addition, portions 117P1 and 117P2 of the planarization layer 117 spaced apart from each other may be formed.

Then, the anode photoresist pattern APR' that is transformed may be removed (e.g., stripped).

Figure 21:
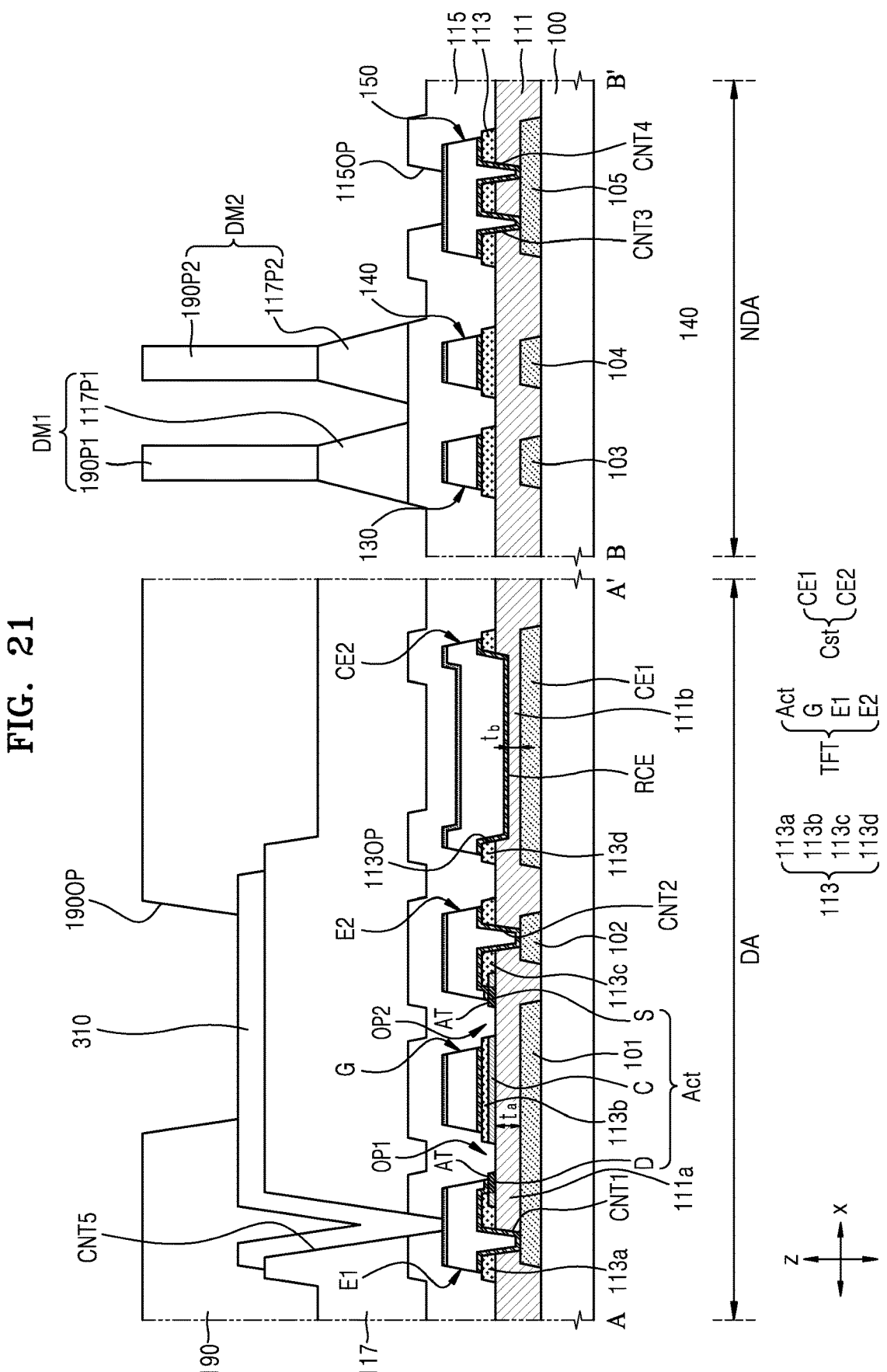

Referring to FIG. 21, the bank layer 190 covering at least a portion of the pixel electrode 310 may be formed on the pixel electrode 310. The opening 1900P that exposes the central portion of the pixel electrode 310 may be formed in the bank layer 190. A seventh mask including a pattern corresponding to the bank layer 190 may be used in forming the bank layer 190. As an example, a photolithography process may be used. In addition, portions 190P1 and 190P2 of the bank layer 190 respectively disposed on the upper portions of the portions 117P1 and 117P2 of the planarization layer 117 may be formed by using the seventh mask. The portions 117P1 and 117P2 of the planarization layer 117, and the portions 190P1 and 190P2 of the bank layer 190 may constitute the first dam DM1 (see FIG. 5) and the second dam DM2 (see FIG. 5).

Referring to FIG. 21, then, the emission layer 320 (see FIG. 5) may be formed in the upper portion of the bank layer 190 by the photolithography process that uses the seventh mask, wherein the emission layer 320 corresponds to the pixel electrode 310. Next, the opposite electrode 330 (see FIG. 5) may be formed on the emission layer 320. As an example, the opposite electrode 330 may be formed by using a deposition method, such as chemical vapor deposition (CVD), thermal CVD (TCVD), plasma enhanced chemical vapor deposition (PECVD), sputtering, e-beam evaporation, and the like.

According to an embodiment, because the display apparatus DV is manufactured by using seven masks, manufacturing costs may be reduced and productivity may be improved. In addition, the storage capacitor Cst of the display apparatus DV may have a sufficient capacitance while having a single capacitor.

According to embodiments, the display apparatus and a method of manufacturing a display apparatus in which a number of masks applied to the manufacturing process is reduced, productivity is improved, and simultaneously, the performance of a capacitor is improved, may be provided. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a thin-film transistor including a semiconductor layer and a gate electrode, wherein the semiconductor layer includes a channel region, a source region, and a drain region, the source region and the drain region disposed on two opposite sides of the channel region, and the gate electrode overlapping the channel region;

a lower electrode disposed under the semiconductor layer;

a capacitor electrically connected to the thin-film transistor and including a first capacitor electrode and a second capacitor electrode disposed over the first capacitor electrode, the first capacitor electrode disposed on a same layer as the lower electrode; and a first insulating layer including a first portion and a second portion, the first portion disposed between the lower electrode and the semiconductor layer, and the second portion disposed between the first capacitor electrode and the second capacitor electrode, wherein a thickness of the second portion of the first insulating layer is less than a thickness of the first portion of the first insulating layer.

2. The display apparatus of claim 1, wherein the first insulating layer includes a recess portion overlapping the first capacitor electrode, and at least a portion of the second capacitor electrode is located inside the recess portion.

3. The display apparatus of claim 2, further comprising a second insulating layer disposed on the first insulating layer, wherein the second insulating layer includes a first portion disposed between the semiconductor layer and the gate electrode, and wherein an opening defined in the second insulating layer overlaps the recess portion.

4. The display apparatus of claim 3, wherein a portion of the second insulating layer is located between a lower surface of the second capacitor electrode and an upper surface of the first insulating layer.

5. The display apparatus of claim 2, wherein the second portion of the first insulating layer is located below the recess portion.

6. The display apparatus of claim 3, wherein a lateral surface of the recess portion of the first insulating layer and a lateral surface of the opening of the second insulating layer are located on a same inclined surface.

7. The display apparatus of claim 1, wherein the second capacitor electrode includes a plurality of sub-layers, and the gate electrode includes a plurality of sub-layers.

8. The display apparatus of claim 7, wherein a number of sub-layers of the second capacitor electrode is equal to a number of sub-layers of the gate electrode.

9. The display apparatus of claim 1, wherein the semiconductor layer includes an oxide semiconductor material.

10. The display apparatus of claim 1, further comprising:

an interlayer insulating layer covering the gate electrode and the second capacitor electrode;

a planarization layer covering the interlayer insulating layer; and a display element disposed on the planarization layer and electrically connected to the thin-film transistor, wherein the display element includes a sub-pixel electrode, an opposite electrode, and an emission layer which is disposed between the sub-pixel electrode and the opposite electrode, the opposite electrode disposed over the sub-pixel electrode.

* * * * *